(12) United States Patent
Ueno et al.

(10) Patent No.: US 6,336,601 B1
(45) Date of Patent: Jan. 8, 2002

(54) METHOD FOR SEPARATING METALLIC MATERIAL FROM WASTE PRINTED CIRCUIT BOARDS, AND DRY DISTILLATION APPARATUS USED FOR WASTE TREATMENT

(75) Inventors: Takayoshi Ueno, Hirakata; Keizo Nakajima, Kawachinagano; Masaaki Suzuki, Osaka; Hiroshi Onishi, Hirakata; Takahiko Terada, Nara, all of (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/458,845

(22) Filed: Dec. 13, 1999

(30) Foreign Application Priority Data

| Dec. 11, 1998 | (JP) | 10-353079 |
| Feb. 17, 1999 | (JP) | 11-037959 |
| Apr. 6, 1999 | (JP) | 11-099455 |
| Aug. 5, 1999 | (JP) | 11-223101 |
| Aug. 16, 1999 | (JP) | 11-223381 |

(51) Int. Cl.[7] ............................................... B02C 19/12
(52) U.S. Cl. ................ 241/23; 241/24.13; 241/DIG. 38
(58) Field of Search .................... 241/23, 65, 24.13, 241/24.14, 24.15, 20, DIG. 38; 29/426.5, 762

(56) References Cited

U.S. PATENT DOCUMENTS

| 5,342,582 A | * | 8/1994 | Horn et al. | 241/DIG. 38 |
| 5,683,040 A | * | 11/1997 | Jakob et al. | 241/DIG. 38 |
| 5,715,592 A |   | 2/1998 | Mori et al. | |
| 5,887,805 A | * | 3/1999 | Chapman | 241/DIG. 38 |
| 5,788,167 A | * | 8/1999 | Chapman | 241/DIG. 38 |
| 5,979,033 A | * | 11/1999 | Chang et al. | 241/DIG. 38 |

FOREIGN PATENT DOCUMENTS

| JP | 6-228667 | 8/1994 |
| JP | 8-139446 | 5/1996 |

* cited by examiner

*Primary Examiner*—Mark Rosenbaum
(74) *Attorney, Agent, or Firm*—Ratner & Prestia

(57) ABSTRACT

A method for treating waste printed circuit boards, the method has the steps of:

heating up for dry-distilling the waste printed circuit boards having copper foil retaining solder in at least a part of the surface, at a temperature of 250° C. or higher;

pulverizing the dry-distilled material of the waste printed circuit boards obtained in the heating step; and separating the pulverized material of the waste printed circuit boards obtained in the pulverizing step, into board resin component and metal component.

51 Claims, 13 Drawing Sheets

METHOD FOR SEPARATING METALLIC MATERIAL FROM WASTE PRINTED CIRCUIT BOARDS, AND DRY DISTILLATION APPARATUS USED FOR WASTE TREATMENT

BACKGROUND OF THE INVENTION

1. Field of the Invention

The present invention relates to a method for separating metallic material, such as copper foil, solder, and electronic parts, from waste printed circuit boards, which are recovered from used electrical products or are discarded in manufacturing processes as inferior products or scraps.

Further, the present invention relates to a dry distillation apparatus used for heating and dry distillation of metal-having resin composites and for separation of metal and resin components.

Moreover, the present invention pertains to technology for cleaning-up dry distillation gas from an apparatus used for heating and dry distillation of waste containing combustible organic material into carbonate to reduce weight.

2. Related Art of the Invention

Land disposal in controlled-type landfill sites is presently a general approach to dispose waste printed circuit boards, for example, contained in used electrical products. Because the controlled-type landfill sites are equipped with isolation sheets surrounding the site, harmful substances, such as lead component originating in solder retained on the waste printed circuit boards are prevented from diffusing into the environment even when such harmful components get dissolved in rainwater.

Nevertheless, in the case of potential damage in the isolation sheets, the harmful substances could diffuse into the environment. Therefore, it is still desired to remove the harmful components, such as solder, from the waste printed circuit boards to make them harmless before disposal. Furthermore, since the printed circuit boards and the electronic parts retained thereon contain valuable metals such as copper, it has been desired to efficiently recover and recycle them.

In addition, waste printed circuit boards are also discarded as inferior products or scraps in manufacturing plants, and are presently treated as industrial waste for land disposal described above. It is also desired to efficiently recover and recycle the valuable metals, such as copper, contained in such waste printed circuit boards.

Reflecting such situation, a couple of methods for treating waste printed circuit boards have been proposed. For example, Japanese Laid-open Patent Application No. Hei 6-228667 discloses a method, wherein printed circuit boards retaining electronic parts are pulverized through a coarse and a fine pulverization processes. Then, the pulverized material is separated and recovered using specific gravity separation process into two components: a portion mainly containing metallic material such as copper, and the other portion mainly consists of resin and filler materials.

To pulverize the waste printed circuit boards as described therein, strong pulverizing force is necessary because of toughness of board portion of the waste printed circuit boards. However, the force strong enough to pulverize the printed circuit boards excessively pulverizes solder potion during the pulverization of the board resin component. The excessive pulverization causes a difficulty in the specific gravity separation process to separate the solder component from the board resin component.

Similarly, electronic parts are also excessively pulverized and become difficult to separate from the board resin component. As such, there has been a problem of low recovery efficiency of the metal component, such as solder and electronic parts.

Another prior art method for treating waste printed circuit boards is disclosed in Japanese Laid-open Patent Application No. Hei 8-139446. As described therein, electronic parts soldered on a printed circuit board are removed therefrom by applying an external force to the board while the solder is heated and re-melted.

In this method, however, the external force is exerted also onto the heated and re-melted solder, making the solder to splash into fine drops. This situation causes another difficulty in the recovery of solder. In addition, regarding the electronic parts that are assembled on circuit boards with lead wire's ends being bent, it is difficult to remove such electronic parts from the circuit boards with this method alone.

On the other hand, a number of heat treatment methods have been proposed for recycling resin material that is contained in used products or manufacturing waste. In one of the methods, the resin material is directly used as fuel in a combustion furnace, and then the heat of combustion of the resin is utilized as energy resource. In an alternative method, the resin material is heated at a high temperature in a low oxygen environment, such as in nitrogen atmosphere, and the generated combustible gas is used as fuel. These methods are called thermal recycle.

In another alternative method, metal-having resin material, which includes printed circuit boards and metallic material such as wiring connectors, is placed into a metal smelting furnace. Valuable metals, such as gold, are recovered and the resin material is used as a substitute for the reducing agent.

In those heat treatment methods using the resin material as a direct fuel, the combustion can be perfect, and hence, its utilization can be efficient, only if the composition of the resin material for treatment is pure. Further, when the material contains metals, the metals remain in the ash, which requires another appropriate treatment.

For printed circuit boards that retain a large amount of solder, a substantial amount of the lead component of the solder retained on the circuit boards can evaporate due to a high temperature in the combustion treatment. Thus, consideration is necessary for proper exhaust gas treatment.

Furthermore, the method for separation of metal and non-metal components using a metal smelting furnace is economically efficient only when a large amount of valuable metals such as gold, is contained in the waste. In other cases of, for example, home appliances, where valuable metals other than copper are scarce, such a method, while technically still possible, has little economical incentive. Therefore, this method has not been generally adopted.

Moreover, a number of methods have been proposed for waste reduction treatment of waste containing combustible organic material, such as garbage discharged from houses or feeding facilities, and offal from food processing plants. Other than incineration treatment and bio-fermentation treatment, there is a method by heating and dry distillation of the waste to reduce its mass. The yielded carbide is used as land improvement stuff.

In the heating and dry distillation method, treatment of dry distillation gas is necessary. Prior art for this includes a method by introducing the gas into a flame combustion furnace to incinerate it at high temperature, and a method of oxidization cleaning of the gas using an oxidizing catalyst.

In the prior art method of incineration of the gas in a flame combustion furnace, a simpler and rather compact apparatus can be used. However, since the composition and amount of the generated dry distillation gas is not constant, the method has a problem that perfect combustion is difficult to maintain, and that unburned components may easily escape.

On the contrary, in the method using an oxidizing catalyst as shown in FIG. 19, dry distillation gas carried out from dry distillation furnace 21B by scavenging fan 22B is introduced through scavenging pipe 23B onto oxidizing catalyst 26B. The temperature of the oxidizing catalyst 26B is maintained by flame burner 25B in gas treatment chamber 24B. A part of combustible component is oxidized by the flame in the vicinity of the flame burner 25B, and the rest part is perfectly cleaned up by the oxidizing catalyst 26B. As such, perfectly treated clean exhaust gas can be exhausted from an exhaust vent 27B.

In this configuration, however, in the case of large variations in the concentration of combustible substances in the dry distillation gas exhausted from dry distillation furnace 21B, stable combustion in the flame burner 25B can deteriorate. Furthermore, when the gas contains a large amount of combustible substances, heat generation in the vicinity of the flame burner 25B becomes excessive, which can overheat oxidizing catalyst 26B.

To stabilize the combustion in the flame burner 25B, excessive air mixing must be avoided. However, an excess of combustible substances causes a shortage of air mixture, which, in turn, suppresses the oxidation reaction on the oxidizing catalyst 26B. As the result, substances not yet reacted, such as odor and carbon monoxide, can escape.

Furthermore, combustion of the flame burner 25B is fixed. Thus, the oxidizing catalyst 26B is kept at around 200–500° C. only for a normal amount of combustible gas. When the waste contains salts and halides, production of harmful substances such as dioxins is suppressed in the vicinity of the flame burner 25B because of the high temperature of 800° C. or higher. However, since the temperature of the oxidizing catalyst 26B downstream is 200–500° C., dioxins can be re-produced here because dioxins are produced at 300–700° C.

SUMMARY OF THE INVENTION (1) The invention has been devised considering the above-mentioned problems in the prior art methods for treating waste printed circuit boards, and an object of the invention is to provide a method for treating waste printed circuit boards, wherein solder contamination into the recovered board resin component is suppressed, whereby metal component and board resin component can be efficiently separated.

Accordingly, the present invention has achieved the above object by providing a method for treating waste printed circuit boards, the method comprising the steps of:

heating up for dry-distilling the waste printed circuit boards having copper foil retaining solder in at least a part of the surface, at a temperature of 250° C. or higher;

pulverizing the dry-distilled material of said waste printed circuit boards obtained in said heating step; and separating the pulverized material of said waste printed circuit boards obtained in said pulverizing step, into board resin component and metal component.

(2) An object of the invention is to provide a method for separating metal component from waste printed circuit boards, wherein metal component is efficiently separated from waste printed circuit boards.

Accordingly, another aspect of the present invention is a method for separating metallic material from waste printed circuit boards, the method comprising the steps of:

heating up the waste printed circuit boards having at least metallic material, in an atmosphere avoiding the burning of the printed circuit board portion of said waste printed circuit boards or in an atmosphere avoiding the oxidation of said metallic material, so that the temperature of at least said printed circuit board portion becomes 250° C. or higher and lower than 500° C.;

pulverizing the substantial printed circuit board portion alone of said waste printed circuit boards heated-up in said heating step into pieces not exceeding a predetermined size; and separating the pulverized pieces of said substantial printed circuit board portion pulverized in said pulverizing step and said metallic material retained on said waste printed circuit boards, depending on the difference in the sizes of said pulverized pieces and of said metallic material.

(3) An object of the invention is to provide a method for separating electronic parts from waste printed circuit boards, wherein the electronic parts are efficiently separated from the waste printed circuit boards without exerting an external force onto the heated and re-melted solder.

Accordingly, still another aspect of the present invention is a method for separating electronic parts from waste printed circuit boards, the method comprising the steps of:

colliding predetermined particles at the waste printed circuit boards being assembled with electronic parts by particles collision operation;

breaking out the junctions between the board portion of said waste printed circuit boards and said electronic parts, substantially without fracturing of said board portion of said waste printed circuit boards thereby, in said particles collision operation; and separating said electronic parts from said waste printed circuit boards thereby, in said particles collision operation.

(4) The invention has been devised to resolve problems in the prior art, and an object of the invention is to provide a dry distillation apparatus used for metal-having resin treatment, whereby resin composite containing cheap metal component can be easily separated.

Accordingly, yet another aspect of the present invention is a dry distillation apparatus used for metal-having resin treatment, the apparatus comprising:

a heating furnace for containing the metal-having resin, a heating means for heating up said heating furnace, and a scavenging means for sucking and removing the gas within said heating furnace;

wherein said heating means heats up said heating furnace so that the contained said metal-having resin loses its hardness; and wherein said contained metal-having resin is heated up without burning because at least the surroundings of said contained metal-having resin is oxygen-poor.

(5) The invention has been devised to resolve problems in the prior art, and an object of the invention is to provide a dry distillation apparatus used for waste treatment, wherein stable and perfect combustion is maintained even with variations in the amount of combustible substances in the dry distillation gas generated from a dry distillation furnace, whereby the clean exhaust gas characteristics can be maintained free of harmful substances.

Accordingly, still yet another aspect of the present invention is a dry distillation apparatus used for waste treatment, the apparatus comprising:

a heating furnace for containing and heating up combustible organic waste being put in;

a heating means for heating up the inside of heating up said heating furnace at a predetermined temperature;

a scavenging means for sucking and removing the dry distillation gas generated within said heating furnace;

a gas treating means connect to upstream or downstream of said scavenging means, and for containing an oxidizing catalyst therein;

a fuel and/or air supplying means for supplying fuel and/or air to the inside of said gas treating means connected to upstream of said gas treating means;

a temperature measuring means for measuring the temperature of said oxidizing catalyst; and a rate controlling means for controlling the supply rate of fuel and/or air supplied by at least said fuel supplying means, in response to the temperature measured by the measuring signal from said temperature measuring means.

The carbide described in this specification generally refers to carbides resulting from board resin component or from printed circuit board portion, but is not restricted to this.

BRIEF DESCRIPTION OF THE DRAWINGS

FIG. 1 8 is a schematic drawing of the configuration of a dry distillation apparatus used for waste treatment in accordance with the still yet another embodiment of the present invention.

DESCRIPTION OF THE REFERENCE NUMERALS

Figure 1:
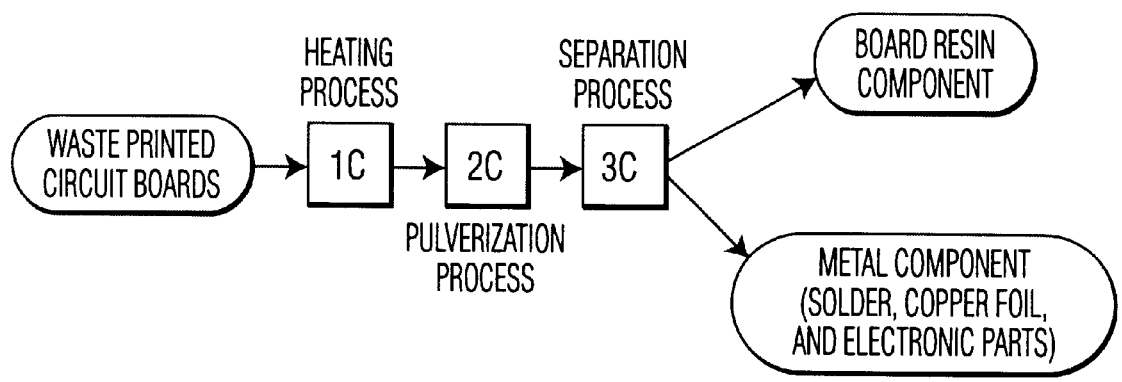
FIG. 1 is a view of an apparatus used for implementation of one embodiment of the method for treating waste printed circuit boards in accordance with the present invention.

1C: heating process
2C: pulverization process
3C: separation process
1: container
2: particle
3: waste printed circuit board
4: arrow indicating the direction of movement
5: injecting means
6: scooping plate
7: rotating tray
8: wall surface
9: belt conveyer
10: easily dropping metallic material collection part
11: hardly dropping metallic material collection part
60: electronic part
70: belt conveyer
80: particles collection part
90: circuit boards and electronic parts mixture collection part
100: board portion
1A: heating furnace
2A: electric heater
3A: thermocouple
4A: temperature controller
5A: rack
6A: treatment material
7A: door
8A: nitrogen gas tubing
9A: injection hole
10A: control valve
11A: pressure gauge
12A: scavenging pipe
13A: scavenging fan
14A: exhaust pipe
15A: gas treatment tank
16A: conveying means
17Aa: entrance
17Ab: exit 18A: gas diffusion suppressing wall
19Aa, 19Ab: flexible sheet
20A: shredding roll
21A: cooling water pipe
22A: collecting basket
1B: heating furnace
2B: electric heater
3B: furnace temperature sensor
4B: furnace temperature controller
5B: conveying belt
6B: roller part
7B: scavenging pipe
8B: admission pipe
9B: gas purifying part
10B: exhaust pipe
11B: exhaust fan
12B: exhaust top
13B: oxidizing catalyst
14B: heat exchanging part
15B: fuel pipe
16B: fuel control valve
17B: catalyst temperature sensor
18B: combustion controller
19B: air supplying pipe

PREFERRED EMBODIMENTS OF THE INVENTION

The first embodiment of the present invention includes a heating process, wherein printed circuit boards are dry-distilled at a temperature of 250° C. or higher; a pulverization process, wherein the dry-distilled material of the printed circuit boards obtained in the heating process is pulverized without fine cutting of the solder; and a separation process, wherein the pulverized material of the waste printed circuit boards obtained in the pulverization process is separated into board resin and metal components.

FIG. 1 is a schematic drawing of an apparatus performing processes from heating through separation. Here, 1C is heating process conducted in the heating surface 2C is pulverization process conducted by the pulverizer, 3C is separation process conducted by the sieve. By processes 1C, 2C, and 3C, waste printed circuit boards are separated into board resin and metal components.

Electronic parts are generally assembled on printed circuit boards by soldering onto copper foil thereon. The present invention focuses attention on a property of copper contacting to the solder. Since copper dissolves fast into solder at high temperature, dry distillation of the printed circuit boards retaining the solder results in better adhesion between the solder and the copper foil, thereby reducing bumps in the solder. Consequently, the solder becomes harder to pulverize during the pulverization process, and remains in a piece with the copper foil and in larger particles after the pulverization process.

In the present embodiment, a treatment temperature of 250° C. or higher is necessary to improve the adhesion of the solder to the copper foil within a couple of hours or less. At the same time, board resin component becomes brittle during dry distillation at 250° C. or higher, and is easily fine-pulverized during the pulverization process. As such, metal component, such as electronic parts, copper foil, and solder, is obtained in larger particles, and easily separated from the fine-pulverized board resin component by the separating operation in the separation process. The solder is recovered as part of the metal component along with the copper, and accordingly contamination by the solder into the board resin component is reduced.

Generally, the brittle resin material can be easily pulverized into less than 100 $\mu$m. Thus, keeping the solder particles larger than 100 $\mu$m in the pulverization process, the separating operation in the separation process becomes easier.

The present embodiment is contemplated to be used for printed circuit boards, wherein the board resin component is epoxy resin, phenol resin, polyester, or polyimide; the substrate of the printed circuit boards is paper, glass cloth, nonwoven glass fabric, or nonwoven aramid fabric; and the electronic parts are assembled thereon by soldering. In particular, with regard to printed circuit boards using paper or aramid resin fibrids as substrate, the substrate also suffers thermal decomposition and becomes brittle during the dry distillation operation in the heating process, and hence, the pulverizing operation in the pulverization process becomes preferably easier. The present method is also applicable to so-called lead-free solder as well as the ordinary Sn/Pb alloy solder.

In the heating process in accordance with the present invention, higher dry distillation temperature results in shorter treatment time required in the heating process, because the copper more easily dissolves into the solder at the higher temperature, and because adhesion between the solder and the copper improves in the shorter time.

Methods for heating include a number of heating means, such as an electric furnace, an infrared heater, a far-infrared heater, an induction heater, and a hot air gun. Dry distillation is preferably conducted in vacuum or in an oxygen-poor atmosphere in order to avoid the burning of the board resin component and to suppress oxidation of the metal component. In this context, oxygen-poor atmosphere means a gas atmosphere having oxygen concentration of 10% or less, and including inert gas atmospheres. An inert gas includes rare gases (such as helium and argon), nitrogen, and carbon dioxide. Nitrogen is preferred as the inert gas due to handling convenience.

Oxidation of metal components can be generally suppressed in such an atmosphere. However, in the case that the metal component is still oxidized by thermal decomposition substances generated from the board resin component, such oxidation can be suppressed by adding a reducing gas, such as hydrogen, to the atmosphere gas.

When the waste printed circuit board contains flame retardant, the heating process can be conducted in the air atmosphere because of the incombustibility of printed circuit board component even in the air atmosphere.

In the pulverization process in accordance with the present embodiment, since the board resin component is brittle due to the dry distillation operation in the heating process, even moderate pulverizing operation can pulverize the board resin component without much aggregating of the resin component to the metal component. Regarding the pulverizing operation, it is necessary to adopt such a pulverization condition that the surface of the solder is not worn during the pulverization. Coarse pulverizers include a jaw crusher, a gyrate crusher, a cone crusher, a roll crusher, an impact crusher, and a hammer crusher. Fine pulverizers include a autogeneous grinding mill, a ball mill, a vibration mill, and a roller mill. Other preferable methods include a method, wherein high-pressure gas, such as high-pressure air, is sprayed onto the circuit board; and a method, wherein the circuit board is pulverized by applying vibration thereon. The reason why these methods are preferable for the implementation of the present embodiment is that the solder surface is not worn thereby. The ball mill is, in particular, preferable because of the simpler configuration and because of the shorter treatment time to pulverize the board resin component. Further, particles having surfaces with a lower hardness than that of solder are very preferably used as balls or pulverization media in order to suppress the wearing of solder surface. In this case, the Vickers hardness can be used as the measure of hardness of pulverization media. Resin or rubber materials having a lower hardness than that of solder, may be coated on the surface. For handling convenience in the pulverization process, dry-distilled printed circuit boards may be preliminary pulverized in around a few centimeter size by a short-time treatment with a coarse pulverizer, and then the resin board portion is further pulverized.

In the separation process in accordance with the present embodiment, the board resin component is pulverized in fine powder whereas the metal component containing solder is not so finely pulverized and in larger particle size. Thus, they can be efficiently separated by ordinary screening operation. They can also be efficiently separated into metal component and board resin component by means of specific gravity separation, such as centrifugal, inertial, and gravity classifications.

The present invention may include extra necessary processes other than the heating, pulverization, and separation processes described above. In an exemplary process, a cutting edge may pass through between a board and an electronic part to cut the lead wire of the electronic part, and then a portion of the electronic part may be removed before the heating process. In another exemplary process, heated and re-melted solder may be removed with a brush, and then a vibration is applied to the printed circuit board to remove a portion of the electronic parts.

EXAMPLES

Evaluation was made on a printed circuit board, wherein electronic parts were assembled by soldering on a paper phenol board having a printed copper foil pattern. Weight of the solder used for the soldering was previously measured. In the heating process, the printed circuit board assembled with the electronic parts was put in a ceramic furnace tube of 90 mm in diameter and 1,000 mm in length. The sample was heated by external heating, and kept at a predetermined dry distillation temperature in 120 min. After natural cooling to 40° C., the printed circuit board was removed from the tube, and now, the heating process has been completed. During the heating process, nitrogen gas was introduced in the tube at a flow rate of 3 liters per minute.

In pulverization process, the circuit board was preliminary pulverized by free falling. Then, ball mill pulverization of 30 min was applied thereto using pulverization media of balls of 10 mm each in diameter.

In separation process, the pulverized material obtained in the pulverization process was screened with a sieve having 500 μm square openings and separated into board resin component, and electronic parts and a metal component both of which remained on top of the screen. To quantify the solder contamination into the obtained board resin component, the solder was dissolved in acid and analyzed with ICP emission spectroscopy. Solder contamination ratio was defined as the ratio of the amount of the solder contamination to the total amount of the solder previously retained on the circuit board.

Examples 1–3 and Comparative Example 1 were conducted with different dry distillation temperatures as shown in Table 1. The pulverization process of Example 1 and 2 used balls made of steel and coated with nylon resin.

On the other hand, the pulverization process of Example 3 used alumina balls.

TABLE 1

|  | Dry distillation temperature | Solder contamination ratio (%) |
| --- | --- | --- |
| Example 1 | 250° C. | 0.5% |
| Example 2 | 600° C. | 0.4% |
| Example 3 | 250° C. | 4.5% |
| Comparative example 1 | 230° C. | Unpulverized board |

In all three of Examples 1,2, and 3, bumps of the solder have been reduced due to the sufficient adhesion between copper and solder during the heating processes. The results of lower solder contamination ratios in the board resin components obtained in Examples 1 and 2 are, therefore, due to the subsequent separation process. In Comparative Example 1, on the contrary, insufficient dry distillation temperature in the heating process resulted in the board resin component not becoming sufficiently brittle and, therefore, the circuit board was not sufficiently pulverized in the pulverization process. Consequently, the board resin component was not able to be separated from the electronic parts and metallic material.

In Example 3, pulverization media having a higher surface hardness than that of solder was used. This hardness caused wearing of the solder surface and increased the solder contamination ratio in comparison with Example 1.

According to the method for treating waste printed circuit boards in accordance with the present invention as described above, solder contamination ratio can be suppressed, and metal and board resin components can be efficiently separated.

(2) A method for separating metallic material from waste printed circuit boards in accordance with the present invention is described below with reference to the drawings.

In the present embodiment described below, waste printed circuit board means: a copper foil laminate board with copper foil being laminated on the substrate, a printed circuit board with wiring on the board, a printed circuit board with electronic parts being assembled and circuits being composed thereon, or a printed circuit board with all or a portion of electronic parts being already removed. Such printed circuit boards can be waste printed circuit boards collected from used products, or inferior products and scraps discarded in manufacturing processes. The board portion of the printed circuit boards contains board resin component, such as epoxy resin, phenol resin, polyester, or polyimide. The substrate of the boards is paper, glass cloth, nonwoven glass fabric, or nonwoven aramid fabric.

Figure 2:
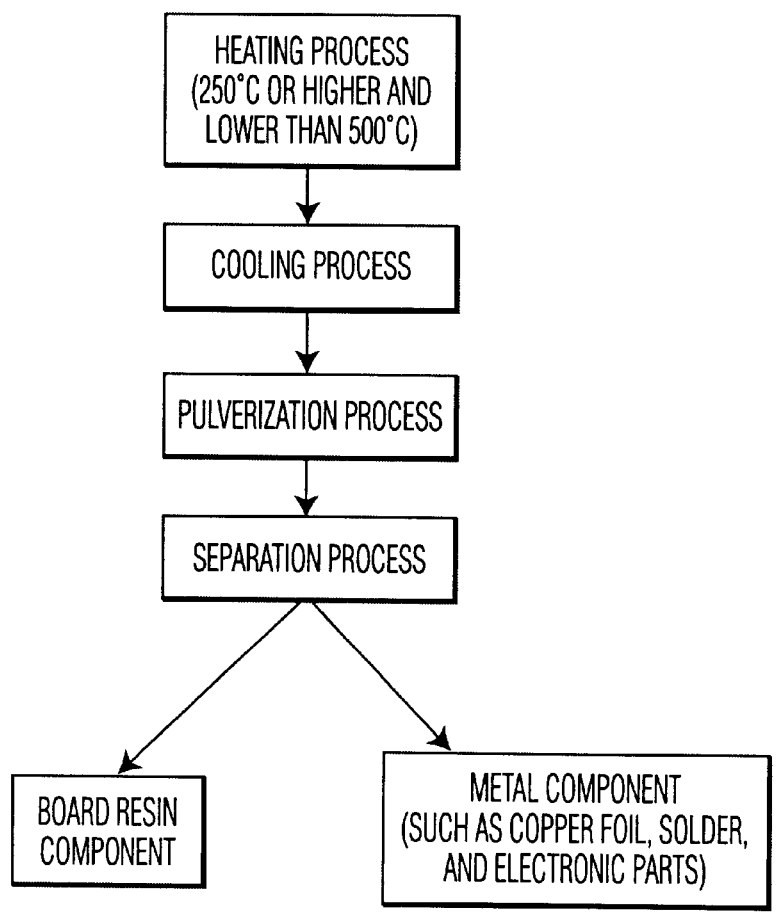
FIG. 2 is a flow chart showing one embodiment of the method for separating metallic material from waste printed circuit boards in accordance with the present invention.

FIG. 2 shows the flow chart of the method for separating metallic material from waste printed circuit boards in accordance with the present embodiment.

The method for separating metallic material from waste printed circuit boards in accordance with the present embodiment, as shown in FIG. 2, begins at a heating process followed by a cooling and a subsequent pulverization processes, and ends at a separation process. In the last process, board resin component is separated from metallic material, such as copper foil, solder, and electronic parts. Strictly speaking, electronic parts often contain resin component. However, in the present embodiment, such electronic parts containing resin component are defined as a part of metallic material.

Each of the heating, cooling, pulverization, and separation processes is described below.

The heating process is described first. The heating process uses an electric furnace, an infrared heater, a far-infrared heater, an induction heater, or a hot air gun. Waste printed circuit boards having metallic material, such as solder and electronic parts, are heated to a temperature of 250° C. or higher and lower than 500° C. measured at the board portion of the waste printed circuit boards. The board resin component of the waste printed circuit boards becomes brittle in the heating process.

It is preferable for the heating process to be conducted in an oxygen-poor atmosphere in order to avoid burning of the board resin component and to suppress oxidation of the metallic material. The oxygen-poor atmosphere means a gas atmosphere having an oxygen concentration of, for example, 10% or less, and includes inert gas atmospheres. By definition, the board resin component does not burn and oxidation of the metal component is suppressed in the oxygen-poor atmosphere. The inert gas includes rare gases (such as helium and argon), nitrogen, and carbon dioxide. The nitrogen is preferred as the inert gas due to handling convenience. The oxygen-poor atmosphere further includes a gas atmosphere at low pressure and a vacuum. In the case that the metallic material is oxidized by thermal decomposition substances from the board resin component, a reducing gas, such as hydrogen, may be added to the atmosphere gas. Such reducing gas can suppress oxidation of the metallic material.

When the waste printed circuit boards contain flame retardant, the heating process can be conducted in the air atmosphere because of the incombustibility of the printed circuit board component even in the air atmosphere.

Printed circuit board portion is heated to a temperature of 250° C. or higher in the heating process described above. Decomposition of the board resin component begins to occur at a temperature of 250° C. or higher, thereby the circuit boards begin to become brittle. As the brittleness increases with increasing temperature, thermal decomposition substances generated from the resin of the board resin component or from additives such as flame retardant in the waste printed circuit boards gradually increase. Environmental contamination by this exhaust gas begins to be a concern. Therefore, focusing attention on the decomposition substrates in the heating process, effect on the environmental load is examined as a function of the heating temperature in detail. As a result, when the waste printed circuit boards contain halides such as organic bromide additives, decomposition substances of hydrogen halides substantially increase at heating temperature not less than 500° C. The hydrogen halides react with lead in the solder, thereby yielding lead halides. This scatters in the exhaust gas. Therefore, heating temperature must be lower than 500° C. In addition, at temperatures not less than 500° C., side reaction of the hydrogen halides with metallic material such as copper foil begins to occur. Accordingly, heating temperature lower than 500° C. is necessary again to maintain the quality of the recovered metallic material. In conclusion, waste printed circuit boards are heated to a temperature of 250° C. or higher and lower than 500° C. in the heating process.

In particular, heat treatment at a temperature of 350° C. or higher and less than 500° C. substantially reduces the time required for the treatment for the brittleness of the waste printed circuit boards in comparison to such treatment at a temperature of 250° C. or higher and lower than 350° C.

The cooling process is described below. The waste printed circuit boards heated in the heating process are cooled in this cooling process. If the waste printed circuit boards heated in the heating process were directly brought into the air, the printed circuit board portion could burn, and the metallic material would be oxidized. Therefore, to avoid these burning of the printed circuit board portion and the oxidation of the metallic material, the waste printed circuit boards heated in the heating process are cooled in an oxygen-poor atmosphere in the cooling process. The oxygen-poor atmosphere is described above. The cooling method includes a natural cooling method in the oxygen-poor atmosphere and a method of spraying an inert gas such as nitrogen at approximately room temperature onto the heated waste printed circuit boards. The cooling of the waste printed circuit boards is necessary to reduce the temperature to, for example, approximately 180° C., so that the printed circuit board portion does not burn.

The pulverization process is described below. The brittle board resin component of the waste printed circuit boards cooled in the cooling process are pulverized in this pulverization process. In the pulverization of the board resin component, pulverization of the metallic material, such as copper foil, solder, and electronic parts, must be suppressed for the easiness of subsequent separation of board resin component and metallic material. Therefore, the pulverization process in accordance with the present embodiment adopts a method using a small pulverizing force, wherein pulverization of the metallic material is suppressed whereas the board resin component is sufficiently pulverized. More specifically, one of the following two methods is used: a particles collision operation, wherein a plurality of particles collides with the waste printed circuit boards treated by the heating process; and a wall collision operation, wherein the waste printed circuit boards collide with wall. In these operations, the impulsive force at each impact is small, and hence, pulverization is suppressed for metallic material such as electronic parts. Furthermore, the usage of the impulsive force suppresses fine pulverization of such metallic material as copper, which is easy to cut due to its thinness. Waste printed circuit boards NOT treated by the heating process can not be pulverized by these particles or wall collision operations. However, the brittleness of waste printed circuit boards treated by the heating process, allows these two operations to substantially selectively pulverize the board resin component. On the other hand, some types of pulverizers generally used for conventional waste treatment are not preferred for the pulverization process in accordance with the present invention. Such pulverizers include a pulverizer having rotating cutters, and a pulverizer having rotating hammers (a hammer mill). These pulverizers excessively pulverize the metallic material, such as electronic parts, copper foil, and solder, because of their excessively strong pulverizing force. The excessive pulverization causes difficulty in subsequent separation and recovery of the metallic material.

Figure 3:
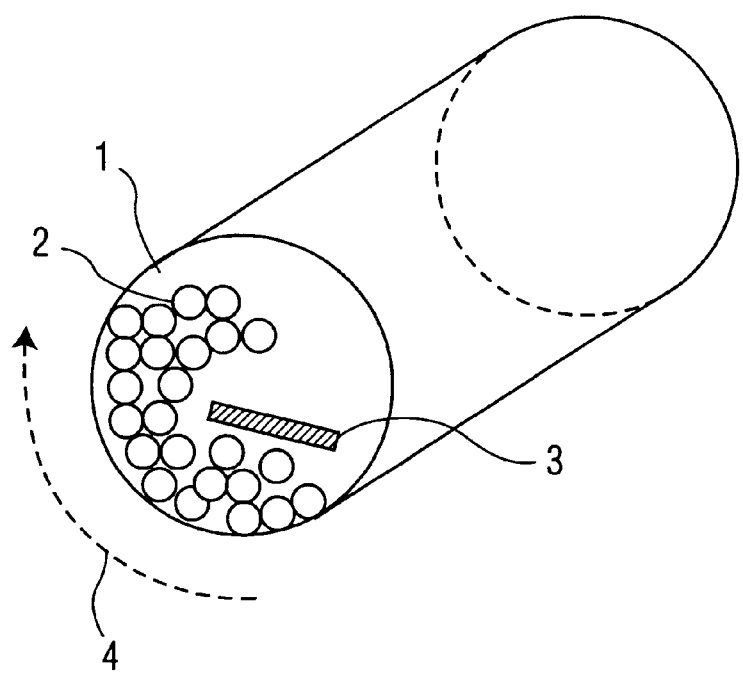
FIG. 3 is an illustration of a particles collision operation in the pulverization process in one embodiment of the method for separating metallic material from waste printed circuit boards in accordance with the present invention.
Figure 4:
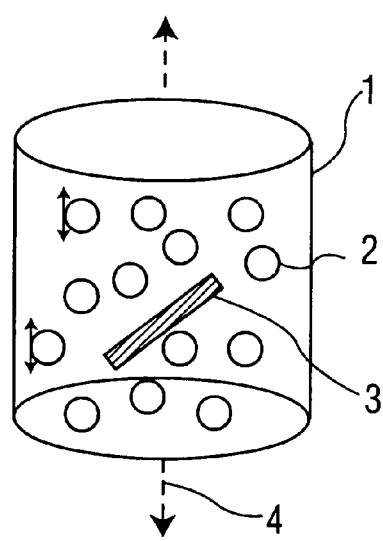
FIG. 4 is an illustration of a particles collision operation different from FIG. 3, in the pulverization process in one embodiment of the method for separating metallic material from waste printed circuit.
Figure 5:
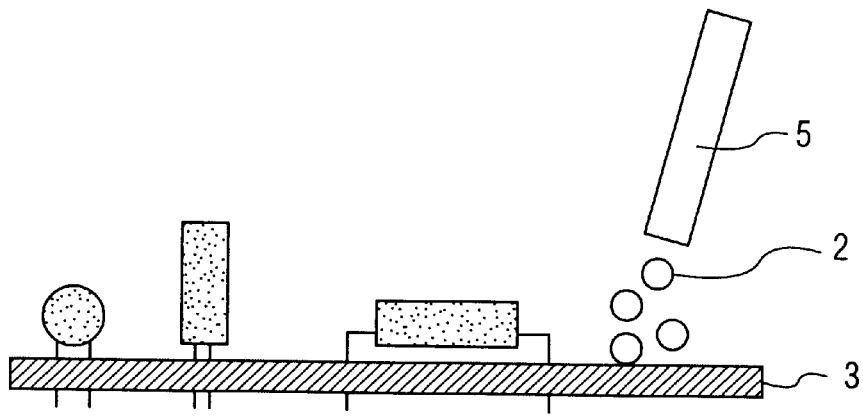
FIG. 5 is an illustration of a particles collision operation different from FIGS. 3 and 4, in the pulverization process in one embodiment of the method for separating metallic material from waste printed circuit boards.

The particles collision operation mentioned above is described below with exemplary illustrations. In an exemplary illustration as shown in FIG. 3, container 1 contains a plurality of particles 2 and heat-treated waste printed circuit board 3. The container 1 rotates in the direction of arrow 4. Pulverization is achieved by free falling of the particles 2. This apparatus is called a tumbling ball mill. In another exemplary illustration of the particles collision operation as shown in FIG. 4, container 1 contains a plurality of particles 2 and heat-treated waste printed circuit board 3. The container 1 vibrates up and down in the direction of arrow 4. Pulverization is achieved by the vibrating movement of the particles 2. This apparatus is called a vibration ball mill. Although an up and down motion is shown in FIG. 4, a right and left motion, a rotation, or combined motion of these can be also used. As shown in FIG. 5, another more exemplary illustration of particles collision operation includes a injecting means 5 for injecting particles 2 at high speed by use of, for example, compressed air. The injecting means 5 injects the plurality of particles 2 onto heat-treated waste printed circuit board 3 to collide to pulverize. Among these exemplary illustrations, the uses of the vibration ball mill and the particles injecting means are preferable, because the high-speed movement of the particles achieves the pulverization treatment in a short time.

The particles used in the particles collision operation described above are made of ceramic material (such as alumina and zirconia), metallic material (such as iron and stainless steel), and/or resin material. Using heavier particles made of ceramics and metals, larger pulverizing force and hence larger pulverization rate are obtained. On the other hand, use of such material as resins having a low surface hardness can suppress wearing of the metallic material of the waste printed circuit boards. Both requirements are preferably and simultaneously satisfied by particles each having a core material of ceramics or metals, further having a surface coated with resin. Regarding particle size, excessively small particles have small pulverizing force and accordingly low pulverization rate. Furthermore, such particles accelerate excessive pulverization of copper foil, which is thin and fragile, because of the small curvature of particles at impact points. In conclusion, the size of the used particles is greater than 1 mm in diameter, more preferably, greater than 10 mm. Moreover, particles of a diameter greater than 20 mm are preferable, because such particles are larger than the majority of electronic parts, and hence, the particles and the electronic parts are efficiently separated by screening in the separation process described later. Shape of the particles are not specifically restricted, but a sphere or similar shape is preferable, because particles having edges may accelerate the excessive pulverization of copper foil.

Shaded portions of the printed circuit board, that is, portions located in the vicinity of, for example, lead wire and being shaded thereby are generally difficult to pulverize. According to the particles collision operation described above, however, such shaded portions can be easily pulverized, because pulverization points of the particles are sufficiently small.

In the particles collision operation described above, the plurality of particles 2 are used to pulverize the board resin component of the waste printed circuit board 3. However, one or a few of the particles 2 may be used to pulverize the board resin component of the waste printed circuit board 3.

Figure 6:
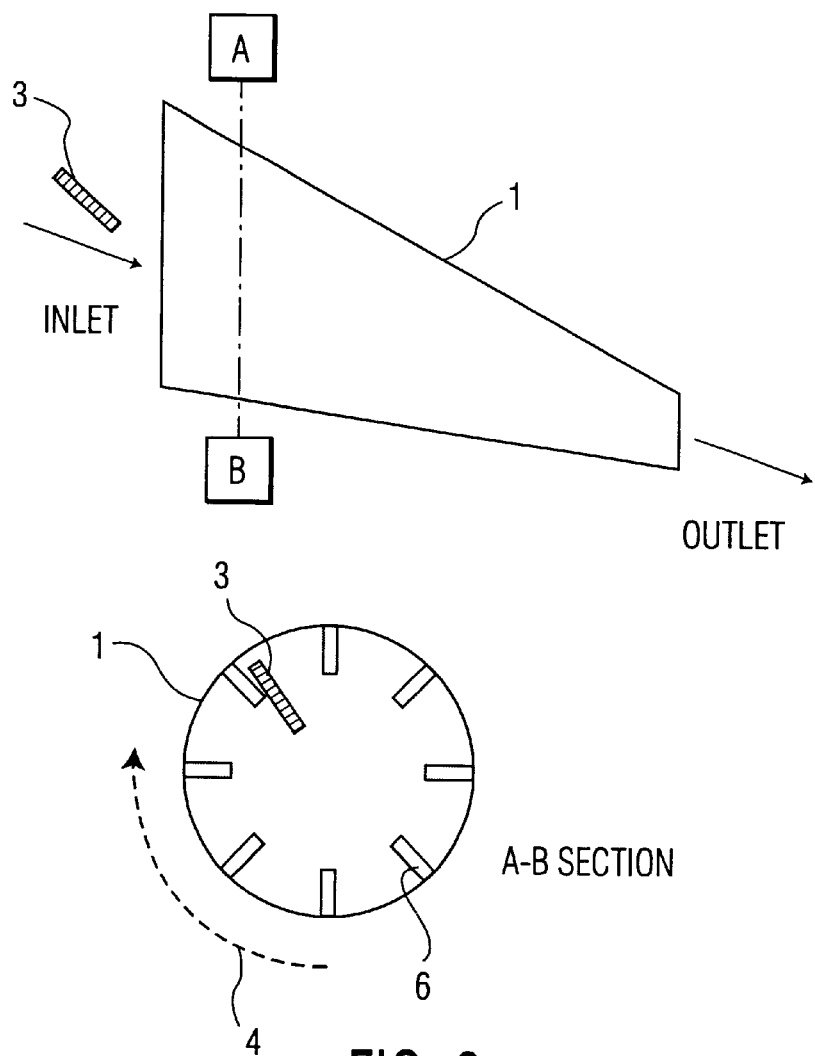
FIG. 6 is an illustration of a wall collision operation in the pulverization process in one embodiment of the method for separating metallic material from waste printed circuit boards in accordance with the present invention.
Figure 7:
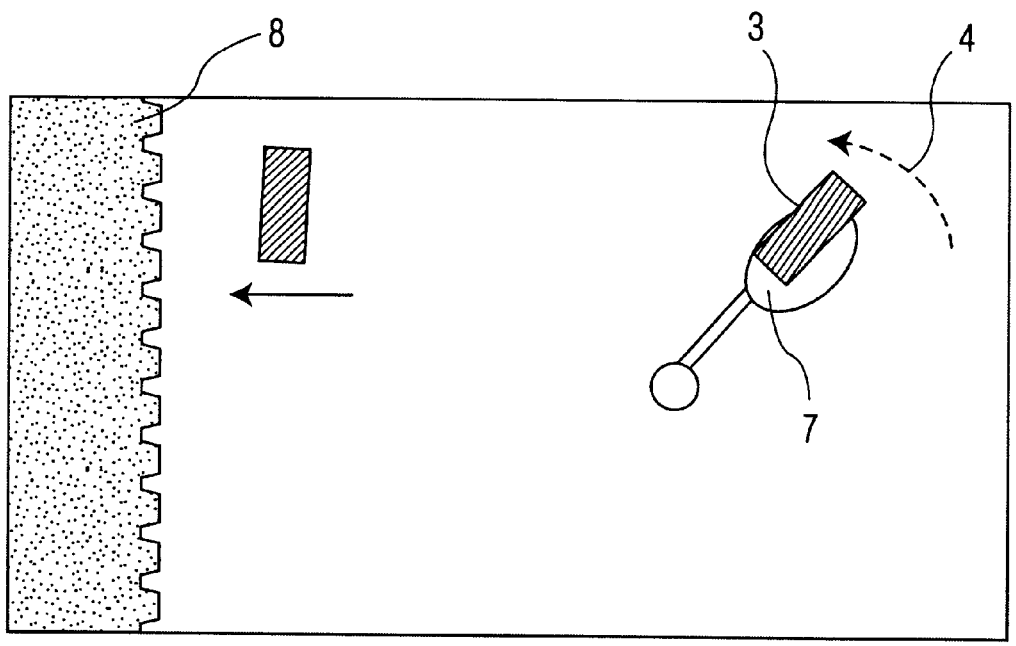
FIG. 7 is an illustration of a wall collision operation different from FIG. 6, in the pulverization process in one embodiment of the method for separating metallic material from waste printed circuit boards.

The wall collision operation mentioned above is described below with exemplary illustrations. An exemplary illustration as shown in FIG. 6 includes a cylindrical container 1 having a plurality of scooping plates 6 attached in the axial direction on the inner wall. Heat-treated waste printed circuit board 3 is put in the inclined container 1. The container 1 rotates in the direction of arrow 4. The waste printed circuit board 3 is scooped up by the scooping plates 6, and then freely falls within the container, and collides with the inner wall of the container 1 and/or with the scooping plates 6. The collision results in pulverization of, substantially, board resin component of the waste printed circuit board 3. The present method is preferable in the point that the waste printed circuit board is sure to be scooped up to top of the container 1 without sliding within the rotating container 1 before free falling for pulverization. Furthermore, the configuration of FIG. 6 is, from the viewpoint of operation, preferable in that pulverized board pieces and metallic material of the pulverized waste printed circuit board 3 are continuously ejected from the outlet of the container 1. In another exemplary illustration of the wall collision operation as shown in FIG. 7, heat-treated waste printed circuit board 3 is thrown at wall 8 by a rotating tray 7. The waste printed circuit board 3 collides to the wall 8, thereby pulverization of, substantially, printed circuit board portion of the waste printed circuit board is achieved. Pulverization rate in the present method is improved using a forced collision of the waste printed circuit board 3 to the wall 8.

Such a wall collision operation can be implemented by a simple apparatus configuration. Particularly in contrast to the particles collision operation described above, it is unnecessary to separate recovered metallic material, such as electronic parts, from the particles.

Ribs in claim 8 of the present invention, which are equipped on the inner wall of a cylindrical container used for pulverization process, may be the scooping plates 6 of FIG. 6. Although a plurality of the scooping plates 6 are equipped on the inner wall of the cylindrical container 1 in FIG. 6 above, at least one scooping plate 6 may be equipped on the inner wall of the cylindrical container 1.

The separation process is described below. In this separation process, finely pulverized powdery pieces of the board resin component, pulverized in the pulverization process, are separated from the substantially unpulverized metallic material. The board resin component is substantially pulverized into powdery pieces in the pulverization process, but the metallic material is substantially unpulverized and remains in larger particles. The difference of the particle sizes between the board resin component pieces and the metallic material pieces allows efficient separation by screening with sieves. In the screening, metallic material is generally recovered in the upper side of a sieve of 100–1,000 $\mu$m square opening, and finely pulverized board resin component is generally recovered in the down side of a sieve of 100–500 $\mu$m square opening. The pulverized material can also be efficiently separated into metallic material and board resin component by means of specific gravity separation, such as centrifugal, inertial, and gravity classifications. When the separated board resin component contains some small pieces of metallic material, further separating operations, such as specific gravity separation, improves the recovery efficiency of metallic material. After the pulverization process, if there remain some larger board resin pieces of insufficiently pulverized printed circuit boards, such pieces can be separated out by screening and returned to the pulverization process to be re-pulverized.

As such, metallic material, such as copper foil, solder, and electronic parts, can be easily separated. Therefore, recovering the separated metallic material, it can be used as recycled material, and at the same time, the waste printed circuit boards can become harmless.

Figure 8:
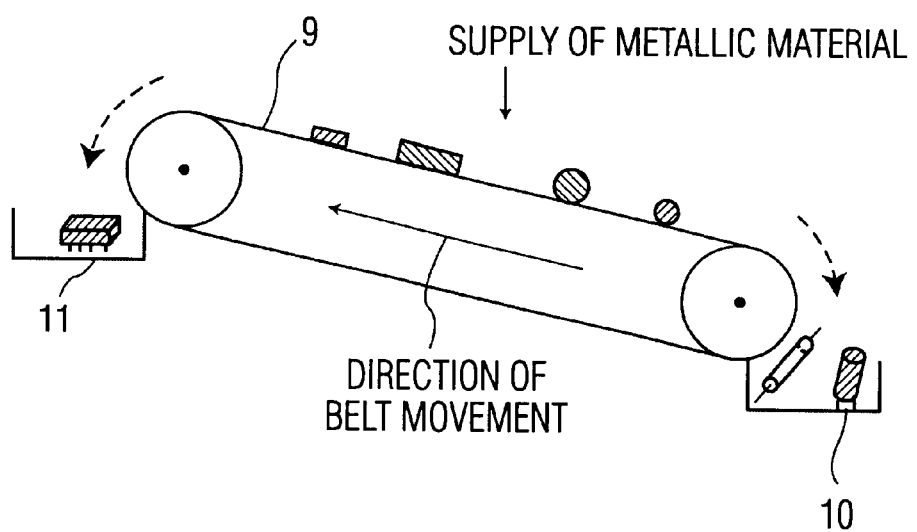
FIG. 8 is an illustration of a metallic-material recovery process in one embodiment of the method for separating metallic material from waste printed circuit boards.

The next step is metallic-material recovery process, wherein the metallic material separated in the separation process is separately collected depending on the shape of each piece. As shown in FIG. 8, belt conveyer 9 having a belt running upward is inclined at a predetermined angle to the horizontal plane. The metallic material separated in the separation process is supplied onto the belt conveyer 9, and then cylindrical metallic material and hardly dropping metallic material are separately collected. More specifically, easily dropping metallic material, such as columnar electronic parts (e.g., aluminum electrolytic condensers) and linear electronic parts (e.g., resistors), easily drop on the belt conveyer 9 and can be collected in easily dropping metallic material collection part 10 at bottom. On the contrary, hardly dropping metallic material, such as flat electronic parts (e.g., IC's) and foil-like pieces (e.g., copper foil), rarely drop on the belt conveyer 9 and can be collected in hardly dropping metallic material collection part 11 at the top. Vibration applied to the belt can improve the separation rate.

Such further separation and recovery of the metallic material depending on the shape is realized because the original shape of the metallic material, such as electronic parts, is well conserved in the processes according to the present invention, wherein the printed circuit boards become brittle in the heating process and are pulverized with a small pulverizing force in the pulverization process.

The present embodiment of the method for separating metallic material from waste printed circuit boards may include extra necessary processes other than the heating, cooling, pulverization, separation, and metallic-material recovery processes described above. In an exemplary process, larger electronic parts and electronic parts that can generate harmful substances in the heating process (including those with lead wires) can be removed before the heating process. In another exemplary process, waste printed circuit boards can be immersed in a decomposition liquid before the heating process. The liquid contains at least one of the following: ethylene glycol, propylene glycol, diethylene glycol, dipropylene glycol, isopropylene glycol, and sodium hydroxide solution. By this immersion treatment, a part of the board resin component ispreliminarily decomposed or swollen, and hence, the board resin component becomes preferably and sufficiently brittle at a lower temperature and in a shorter time during the heating process. Immersion treatment at a higher temperature is more preferable because of acceleration in the decomposition and swelling of the board resin component. Practical temperatures for the immersion treatment are 50–300° C.

The embodiment described above includes the heating, cooling, and pulverization processes in the sequential order. However, when the waste printed circuit boards do not contain solder, the pulverization process may be conducted simultaneously with the heating process. This is because the scattering of re-melted solder is not a concern in this situation. In another approach, the pulverization process may be conducted at a high temperature without substantially cooling the waste printed circuit boards after the heating process. Similarly, the separation process may be conducted without cooling of the waste printed circuit boards. In that case, the pulverization and/or separation processes may be conducted in an oxygen-poor atmosphere described above in order to avoid burning of the printed circuit board portion and oxidation of the metallic material. Further in that case, the hot board resin component and metallic material are cooled down after the pulverization or separation processes, and then the metallic-material recovery process is conducted. Methods for cooling down the hot board resin component and metallic material include a natural cooling method in the oxygen-poor atmosphere described above and a method for spraying an inert gas, such as nitrogen, at around room temperature onto the hot board resin component and metallic material in order to avoid burning of the printed circuit board portion and oxidation of the metallic material.

With regard to printed circuit boards containing a flame retardant or halogen component, such as chlorine and bromine, and/or antimony, when such waste printed circuit boards are heat-treated in their original shape, the printed circuit board pieces separated and recovered in the separation process can contain a remaining portion of these components.

Considering final disposal of printed circuit board portion after the recovery, the halogen and antimony components can become environmental load, depending on the method of the disposal. Thus, it is desired to remove such flame retardant components during the recovery of the board portion.

Accordingly, the present invention desirably includes a heat and remove process, wherein the pulverized board pieces of the waste printed circuit boards being separated after the heating, pulverization, and separation processes are heated to 350° C. or higher in an atmosphere chosen to avoid burning the pulverized board pieces, thereby the flame retardant is removed from the waste printed circuit boards.

The flame retardant containing halogen and/or antimony components begins to thermally decompose at around 250° C., thereby to provide incombustibility. Thus, the halogen and/or antimony components are released from the circuit boards in the heating process in accordance with the present invention. However, in the heating process keeping original shape of the boards, surface area of the boards is not large. And further, the board portion does not melt in this heating process because the waste printed circuit boards are made of a thermosetting resin, such as phenol and epoxy resins. Therefore, the halogen and/or antimony components are unlikely to escape from the circuit boards due to heating during this process.

On the contrary, in the present invention, heating is conducted on the pulverized pieces of the printed circuit board portion, the pieces having been separated during the separation process and hence having a large total surface area. Therefore, the halogen and/or antimony components easily escape from the circuit boards by heating.

The heating temperature of 350° C. or higher is necessary in the heating process in accordance with the present invention in order to easily remove the halogen and/or antimony components. Furthermore, the heating must be conducted in such an atmosphere that the pulverized pieces of the printed circuit boards do not burn, in order to recycle the printed circuit board portion. An oxygen-poor atmosphere is preferable. However, air is also acceptable for a heat and remove process at temperature lower than 500° C.

Lead component, one of the environmental-load substances contained in waste printed circuit boards, exists mainly in the plating of lead wires and the solder for assembling. Another source of the lead component is stabilizers of polyvinyl chloride used as covering resin, and such lead component exists in the forms of basic carbonates, tribasic sulfates, and lead stearate.

According to the present invention, a part of lead-containing component, such as the plating of lead wires of electronic parts and the solder for assembling electronic parts, is not finely pulverized, and hence, easily separated from the pulverized pieces of the printed circuit board portion, and recovered as part of the metallic-material component. However, another part of lead-containing component, i.e., stabilizers of polyvinyl chloride, is originally dispersed in board resin. Accordingly, such part of lead-containing component mixes into the finely pulverized piece component of the printed circuit board portion when the present invention is applied.

On the other hand, antimony-containing component of flame retardant is contained in the printed circuit board portion. This antimony-containing component is also dispersed in board resin, and hence, mixes into the finely pulverized piece component of the printed circuit board portion when the present invention is applied.

As such, considering the recycling of the pulverized piece component of the printed circuit board portion, it is desirable to remove such contamination of lead and antimony components. Therefore, in the present invention, it is preferable to conduct a dissolve and remove process, wherein the pulverized pieces of the waste printed circuit board portion are treated with water, whereby heavy metals are dissolved out from the pulverized pieces of the waste printed circuit board portion.

Lead component, such as stabilizers of polyvinyl chloride, and hydrogen chloride resulting from thermal decomposition of the polyvinyl chloride in the dry distillation process reacts. This reaction yields lead chloride.

When printed circuit boards contain bromic flame retardant, bromine gas and hydrogen bromide are generated by thermal decomposition in the dry distillation process. These bromic substances can react with the lead compounds to form lead bromide. As such, in the dry distillation process, halogen gases and hydrogen halide gases resulting from thermal decomposition react with the lead component to yield lead halides. These lead halides mix into the pulverized pieces of the printed circuit board portion recovered in the separation process.

Since these lead halides are sufficiently soluble, such lead component is easily dissolved out from the pulverized pieces of the printed circuit board portion by a dissolve-out process, wherein the pulverized and separated pieces of the printed circuit board portion are treated with water. A similar situation to this exists in the case of antimony. In the dry distillation process, halogen gases and hydrogen halide gases resulting from thermal decomposition react with the antimony component to yield antimony halides. These antimony halides mix into the pulverized pieces of the printed circuit board portion recovered in the separation process.

Since these antimony halides are also sufficiently soluble, such antimony component is easily dissolved out from the pulverized pieces of the printed circuit board portion by the dissolve-out process using water in accordance with the present invention.

The dissolve-out process in accordance with the present invention includes use of appropriate additives to the water. The method for the water treatment includes a method by immersing the separated printed circuit board portion into water and a method of spraying water onto the separated printed circuit board portion.

EXAMPLES

The present invention is described in detail below with particular examples.

Example 1

Waste printed circuit board (size of 50 mm×150 mm) used in this Example had a composite board made of nonwoven glass fabric/glass cloth and epoxy resin. The board substrate contained bromic flame retardant, and the printed circuit board was assembled mainly with IC's, aluminum electrolytic condensers, fixed resistors, and connectors. The waste printed circuit board was put in a ceramic furnace tube of 90 mm in diameter and 1,000 mm in length, and then heated from outside of the tube, and kept at 250° C. in 120 min. After natural cooling to 40° C., the waste printed circuit board was removed from the tube, and the heating and cooling processes were completed. During the heating and cooling processes, nitrogen gas was being introduced in the tube at a flow rate of 3 liters per minute. In pulverization process, a vibration ball mill (Paint Shaker, Asada Tekkoshyo Co., Ltd.) was used. Vibration of the mill was 640 cycles per minute and 8 mm in amplitude. Iron particles (20 mm each) coated with nylon resin and the heat-treated waste printed circuit board were put in a cylindrical stainless container of 130 mm inner diameter and 180 mm depth. Obtained pulverized material was screened with a sieve having 200 μm openings and separated into a board resin component collected under the sieve and a metallic-material component (including electronic parts) on the sieve.

Two another cases were similarly conducted with heating temperatures of 350° C. and 450° C., respectively. A comparative case was conducted without heating and cooling processes. Another two comparative cases were conducted with temperatures of 200° C. and 500° C., respectively. The other conditions were the same. The results are shown in Table 2. Pulverization time was measured to determine the time required for substantially complete pulverization of the circuit board. Chemical analysis for lead was conducted to examine the vaporization of the solder into exhaust gas in the heating process.

TABLE 2

|  | Heating temperature (° C.) | Required pulverization time (Min) | Lead scattering |
|---|---|---|---|
| Example | 250 | 30 | No |
| Example | 350 | 10 | No |
| Example | 450 | 10 | No |
| Comparative example | No heating | Unpulverized | — |
| Comparative example | 200 | Unpulverized | No |
| Comparative example | 500 | 10 | Detected |

As shown in Table 2, when the waste printed circuit board was treated with temperature of 250° C. or higher and lower than 500° C., lead was not detected in the exhaust gas, and the pulverized material was well separated into board resin component and metallic material (electronic parts, copper foil, and solder). In particular, heating temperatures of 350° C. or higher and lower than 500° C. reduced the pulverization time. On the contrary, in the comparative cases of no heating or of heating temperature of 200° C., the circuit board did not become sufficiently brittle and was not pulverized. With the heating temperature of 500° C., lead was detected in the exhaust gas.

Example 2

The same type of the waste printed circuit board as used in Example 1 was used in this Example. Heating and cooling processes were conducted similarly to Example 1. The heating temperature was 350° C. In pulverization process, an injection tooling machine (Fuji Seisakusyo, Co., Ltd.) was used, and nylon resin particles of 2 mm in diameter were injected at a injection pressure of 0.5 MPa onto the waste printed circuit board after the cooling process. Obtained pulverized material was screened with a sieve having 200 μm openings and separated into a board resin component collected under the sieve and a metallic-material component (including electronic parts) on the sieve.

The circuit board was substantially pulverized in around 5 min in the pulverization process. The pulverized material was well separated into board resin component and metallic material (electronic parts, copper foil, and solder) in the subsequent separation process.

Example 3

Waste printed circuit board (size of 50 mm×150 mm) of this Example had a paper phenol board made of kraft paper and phenol resin. The board substrate contained bromic flame retardant, and the printed circuit board was assembled with electronic parts, mainly IC's, aluminum electrolytic condensers, and fixed resistors. Heating and cooling processes were conducted similarly to Example 1. The heating temperature was 350° C. In pulverization process, a wall collision operation was used, wherein the waste printed circuit board was put in a predetermined bag and thrown at the floor fifty times. Obtained pulverized material was screened with a sieve having 500 μm openings and separated into a board resin component collected under the sieve and a metallic-material component (including electronic parts) on the sieve. Further, a metallic-material recovery process using a belt conveyer was conducted. The conveyer was running upward with a belt speed of 150 mm/s and inclined at 20 degrees to the horizontal plane. The metallic material collected in the separation process was supplied onto the belt conveyer for the metallic-material recovery.

As the result, the circuit board was substantially pulverized in the pulverization process. The pulverized material was well separated into board resin component and metallic material in the subsequent separation process. Further, in the metallic-material recovery process, the material was separated into a group including aluminum electrolytic condensers and fixed resistors, and a group including IC's and copper foil.

Example 4

Waste printed circuit board (size of 50 mm×150 mm) of this Example had a paper phenol board made of kraft paper and phenol resin. The board substrate contained bromic flame retardant, and the printed circuit board had wiring alone. Heating and cooling processes were conducted similarly to Example 1. The heating temperature was 350° C. In pulverization process, a wall collision operation was used, wherein the cooled waste printed circuit board was put in a cylindrical container (inner diameter 300 mm×depth 500 mm) having scooping plates attached with separation angle of 45 degrees on the inner wall. The container was rotated at 500 rotations per minute. Obtained pulverized material was screened with a sieve having 500 μm openings and separated into a board resin component collected under the sieve and a metallic-material component (copper foil) on the sieve.

The circuit board was substantially pulverized in around 10 min in the pulverization process. The pulverized material was well separated into board resin component and metallic material (copper foil) in the subsequent separation process.

Example 5

The same type of the waste printed circuit board of Example 1 was used in this Example. An immersion treatment process was conducted by immersing the printed circuit board into ethylene glycol at 170° C. in 2 hours. After that, heating and cooling processes were conducted similarly to Example 1. The heating temperature was 250° C. In pulverization process, a vibration ball mill was used under the same conditions as in Example 1. Obtained pulverized material was screened with a sieve having 200 μm openings and separated into a board resin component collected under the sieve and a metallic-material component (including electronic parts) on the sieve.

In the present Example, the immersion treatment before the heating process reduced the pulverization time to 10 min, whereas the corresponding time was 30 min in a case with heating temperature of 250° C. in Example 1. After that, the pulverized material was well separated into board resin component and metallic material (electronic parts, copper foil, and solder).

Example 6

The board resin component collected under the sieve in Example 3 above was heat-treated. In this process, the board resin component was heated in a ceramic furnace tube of 90 mm in diameter and 1,000 mm in length, and kept at 350° C. in 120 min. After cooling to 40° C., the board resin component was removed from the tube. During the process, nitrogen gas was being introduced in the tube at a flow rate of 3 litters per minute.

Bromine content was measure before and after this heat and remove process. The bromine content of 5.5% by weight before the heat and remove process was well reduced to 0.1% by weight after the heat and remove process.

Example 7

Waste printed circuit board (size of 50 mm×150 mm) used in this Example had a paper phenol board made of kraft paper and phenol resin. The board substrate contained bromic flame retardant. The printed circuit board was assembled with electronic parts, mainly IC's, aluminum electrolytic condensers, and fixed resistors, and further assembled with lead wires. Heating, cooling, pulverization, and separation processes were conducted similarly to Example 1. The heating temperature was 350° C. Board resin component collected under the sieve was obtained. The obtained board resin component was mixed with ten times the obtained board resin weight of water, and immersed and agitated in the water for 6 hours in this dissolve-out process. After that, the board resin component was collected by filtration, and dried.

Before and after this dissolve-out process, lead component contained in the board resin component was dissolved out with an acid and measured using ICP emission spectroscopy. The lead content of 0.2% by weight before the dissolve-out process was reduced to 0.0003% by weight after the dissolve-out process.

Comparative Example 1

The same type of the waste printed circuit board used in Example 1 was used in this Example. Heating and cooling processes were conducted similarly to Example 1. The heating temperature was 350° C. In pulverization process, a hammer mill (H-12 Type, Hosokawa Mikuron Co., Ltd.) was used. The mill had a hammer rotating at 2,800 rotations per minute. Obtained pulverized material was screened with a sieve having 200 μm openings for separation into a board resin component collected under the sieve and a metallic-material component (including electronic parts) on the sieve.

The electronic parts were also finely pulverized in this pulverization process, and the collected board resin component under the sieve was contaminated with metal pieces, such as copper foil and lead wires of electronic parts. In conclusion, the metallic material was not efficiently separated by this process.

As such, the present invention provides a method for separating metal component from waste printed circuit boards, wherein metal component is efficiently separated from waste printed circuit boards.

(3) A method for separating electronic parts from waste printed circuit boards in accordance with the present invention is described below with reference to the drawings.

Waste printed circuit board in this embodiment means a printed circuit board assembled with electronic parts thereon, without any restriction on the form of assembling. The present embodiment is neither restricted to a specific type of electronic parts nor to a specific material of circuit board.

A method for separating electronic parts from waste printed circuit boards in accordance with the present embodiment is characterized by the use of a particles collision operation colliding particles at waste printed circuit boards.

Figure 9:
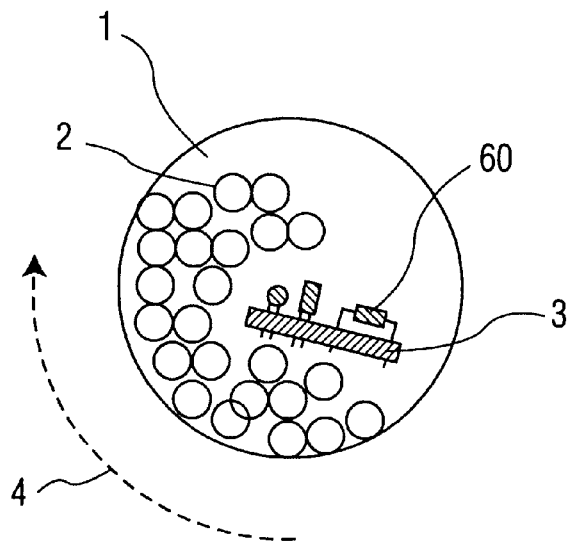
FIG. 9 is an illustration of one embodiment of the method for separating electronic parts from waste printed circuit boards.

In an exemplary illustration as shown in FIG. 9, cylindrical container 1 contains a plurality of particles 2 and waste printed circuit board 3. The container 1 rotates in the direction of arrow 4. Collision between the plurality of particles 2 and the waste printed circuit board 3 is achieved by free falling or other movement of the particles 2. This apparatus is called a tumbling ball mill.

Figure 10:
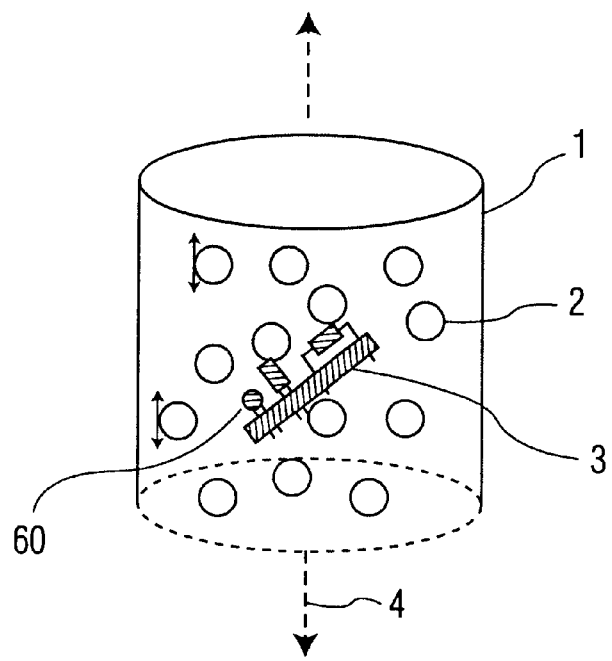
FIG. 10 is an illustration of one embodiment different from FIG. 9, of the method for separating electronic parts from waste printed circuit boards.

In another exemplary illustration of the particles collision operation as shown in FIG. 10, container 1 contains a plurality of particles 2 and waste printed circuit board 3. The container 1 vibrates up and down in the direction of arrow 4. Collision by the plurality of particles 2 at the waste printed circuit board 3 is achieved by free falling or other movement of the particles 2. This apparatus is called a vibration ball mill. Although an up and down motion is shown in FIG. 10, a right and left motion, a rotation, or combined motion of these can be also used.

Figure 11:
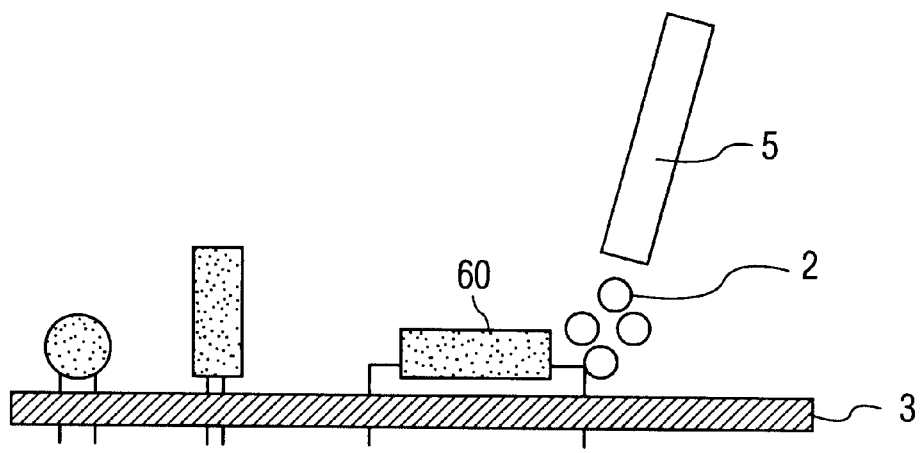
FIG. 11 is an illustration of one embodiment different from FIGS. 9 and 10, of the method for separating electronic parts from waste printed circuit boards.

As shown in FIG. 11, another exemplary illustration of particles collision operation includes an injecting means 5 for injecting particles 2 at high speed by use of, for example, compressed air. The injecting means 5 injects the plurality of particles 2 to collide with waste printed circuit board 3.

Use of the tumbling ball mill and the vibration ball mill are both preferable because of their simple apparatus configuration.

According to the particles collision operation described above, a junction portion between electronic part 60 and the board portion, i.e. solder and lead wire, is impacted with impulsive force by the particles 2. Then, the circuit board and the electronic part become disconnected apart. This selective breakage of the junction portion comes from the fact that the board portion is made of a tough material and is scarcely fractured, whereas the junction portion is weak against impulsive forces. In other words, the impulsive force from the impact by particles 2 on the circuit board is strong enough to disconnect the electronic part 60 from the board portion, whereas is not strong enough to fracture the board portion. As such, electronic part 60 substantially alone is disconnected from the board portion, and hence, the electronic part 60 is easily collected.

The time required for the separation of the electronic part 60 by the particles collision operation described above depends on the mass of each particle 2 and the collision velocity of the particles 2 with the waste printed circuit board 3. If the mass or the collision velocity of the particles 2 is too small, the impulsive force is insufficient to disconnect the electronic part 60 from the circuit board. If the mass and/or collision velocity is too large, the board portion will be fractured. Accordingly, the mass and collision velocity of the particles 2 used must be selected appropriately. For example, using a larger container 1 for the tumbling ball mill, even light particles 2 can obtain larger collision velocity and hence sufficient impulsive force because of the longer falling distance with the container. On the contrary, vibration ball mill and the injection means 5 originally can accelerate the particles more strongly than the tumbling ball mill, and hence, a sufficient impulsive force is obtained even in a smaller apparatus configuration. However, excessively large collision velocity causes fracture of the board portion, and hence, the collision velocity must be set appropriately depending on the mass of the particles 2 used, so as to avoid the fracture of the board portion. Note that the mass of the particles 2 depends on size of each particle 2 and material (density) of the particles 2, whereas the collision velocity depends on operating method of the particles collision operation.

Size of the particles 2 in accordance with the present embodiment is desirably not excessively larger than the electronic part 60 because such large particles have difficulty colliding with junction portions shaded by electronic parts, for example, a junction portion located in the vicinity of the lead wire of electronic part 60 and shaded by the electronic part 60. Considering the size of electronic part 60 used generally, desirable size of the particles is 50 mm or less. Grains 2 of such size can easily collide at junction portions between the electronic part 60 and the board portion, to disconnect the electronic part 60 from the board portion. On the other hand, excessively small particles 2 have a light mass and hence insufficient impulsive force. Consequently, particle size of 5 mm or greater is desired. For example, 10 mm particles made of zirconia, which has a large specific gravity, can disconnect the electronic part 60. On the contrary, such particles less than 5 mm, which have a diameter less than half of the 10 mm particles and a mass less than ⅛ of the 10 mm particles, cannot efficiently disconnect the electronic part 60 due to the insufficient impulsive force. This point is described in detail below with regard to Example 1.

Based on the desired range of the particle size, materials having a higher density is preferable for particles 2. This is because particles made of such materials with a higher specific gravity would have a larger mass even for smaller size, and hence, the particles would have a sufficient impulsive force at a lower velocity. Specifically, the following materials can be used: alumina (density of 3.6 $g/cm^3$), zirconia (density of 6.0 $g/cm^3$), silica (density of 2.2 $g/cm^3$), silicon nitride (density of 3.2 $g/cm^3$), silicon carbide (density of 3.1 $g/cm^3$), iron (density of 7.9 $g/cm^3$), and stainless steel (density of 7.9 $g/cm^3$). The first five materials are ceramics and the other two are metals. In particular, zirconia, iron, and stainless steel are preferable because of their higher densities. Furthermore, each particle having a core of ceramics or metal can be coated with resin, such as nylon, or rubber material.

Figure 12:
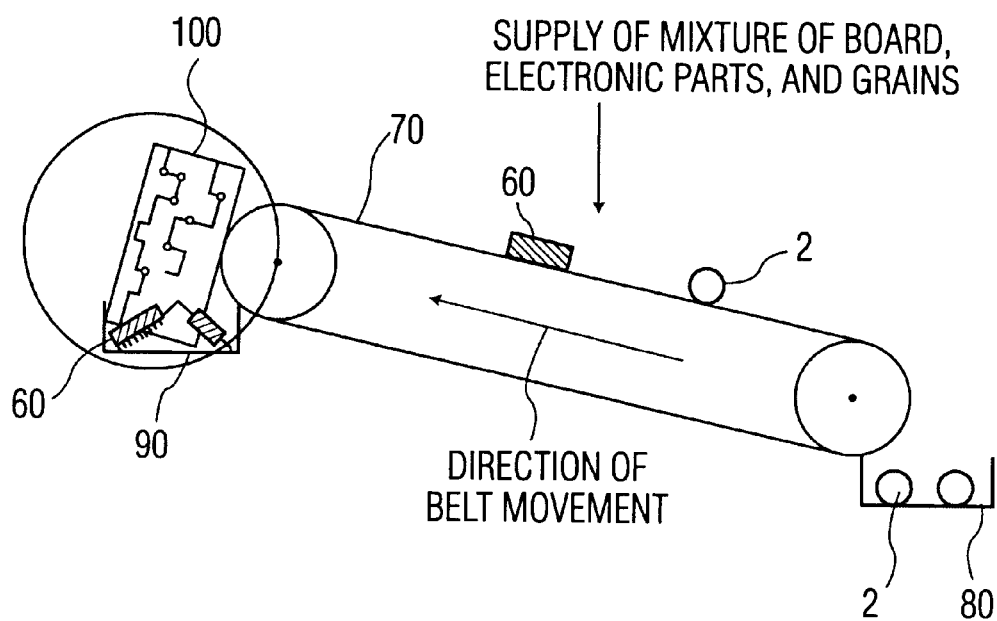
FIG. 12 is an illustration of the method for separating and collecting at least a portion of electronic parts and board portion of the waste printed circuit boards from particles, in one embodiment in accordance with the present invention.

The shape of the particles is not specifically restricted, but a sphere-like or similar shape is preferable for the particles 2, because such particles can avoid the wearing of copper foil and solder by impact. Furthermore, such sphere-like particles can be easily separated from a part of the electronic part 60 after the particles collision operation. That is, when the mixture of the board portion 100, the particles 2, and the electronic part 60 are supplied onto the upward-moving belt of belt conveyer 70 as shown in FIG. 12, the spherical particles 2 are collected in a particles collection part 80 at bottom. On the other hand, the electronic part 60 and the board portion 100, which are generally hardly-dropping, more likely to remain not roll off of the conveyor belt, in comparison with the spherical particles 2, and are collected in a board portion and electronic part mixture collection part 90 on top. However, a part of the electronic part 60, having easy-dropping shape, is collected in the particles collection part 80. Furthermore, to separate the board portion 100 and the electronic part 60 both collected in the board portion and electronic part mixture collection part 90, a belt conveyer having a larger inclination can be used. When the board portion 100 and the electronic part 60 are supplied onto this belt conveyer, the easily-dropping electronic part 60, which is more likely to fall off of the conveyor belt in comparison to the board portion 100, is collected at the bottom whereas the board portion 100 is collected on top. Moreover, to separate the particles 2 and the electronic part 60 both collected in the particles collection part 80, a belt conveyer having a smaller inclination can be used. When the particles 2 and the electronic part 60 are supplied onto this belt conveyer, the easily-dropping particles 2, in comparison to the electronic part 60, are collected at bottom whereas the electronic part 60 is collected on top. However, in the separating of the board portion 100 and the electronic part 60, and in the separation of the particles 2 and the electronic part 60, the inclination and belt speed of the belt conveyer must be set appropriately. In addition, when the inclination and belt speed of the belt conveyer 70 of FIG. 12 are set appropriately, the highly easily-dropping particles 2 alone can be collected at bottom, from the mixture of the board portion 100, the particles 2, and the electronic part 60 that is supplied onto the belt. Further, in the separating of the board portion 100 and the electronic part 60, a screening operation can easily separate them because the board portion 100 is larger than the electronic part 60.

EXAMPLES

The present invention is described in detail below with particular examples.

Example 1

Waste printed circuit board (size of 70 mm×90 mm) of this Example had a composite board made of nonwoven glass fabric/glass cloth and epoxy resin. The printed circuit board was assembled mainly with IC's, aluminum electrolytic condensers, fixed resistors, and connectors on one side of the board. A plurality of 10 mm zirconia particles and the waste printed circuit board were put in a cylindrical stainless container of 130 mm inner diameter and 180 mm depth. A vibration ball mill (Paint Shaker, Asada Tekkoshyo Co., Ltd.) having a vibration of 640 cycles per minute was used to shake the container. This particles collision operation was used for 5 hours. Almost all electronic parts were disconnected from the composite board portion without fracture of the board portion. After that, the disconnected mixture of the composite board portion, the electronic parts, and zirconia particles was supplied onto the belt of a belt conveyer moving upward at 150 mm/s and having a inclination of 10 degrees. The zircon particles were collected in the bottom collection part. The composite board portion and the electronic parts were collected in the top collection part. Further after that, the mixture of the composite board portion and the electronic parts collected in top collection part were supplied onto the belt of a belt conveyer moving upward at 150 mm/s and having a inclination of 30 degrees. The electronic parts were collected in the bottom collection part. The composite board portion was collected in the top collection part.

Example 2

A particles collision operation similar to Example 1 was conducted but with 40 mm alumina particles instead of the particles of Example 1. In around 3 min, almost all electronic parts were disconnected from the composite board portion without fracture of the board portion. After that, using conveyer operations similar to Example 1, the mixture of the composite board portion, the electronic parts, and the alumina particles was well separated and collected into each component.

Example 3

The same type of the waste printed circuit board of Example 1 was used in this Example. The tumbling ball mill (BM-1500, Chuo Kakouki Co., Ltd.) used had a cylindrical container of 1,250 mm inner diameter and 1,250 mm depth. A plurality of 10 mm stainless steel particles and the waste printed circuit board were put in the container, which was rotated at 25 rotations per minute. This particles collision operation was continued for 8 hours. Almost all electronic parts were disconnected from the composite board portion without fracture of the composite board portion. After that, using a conveyer operation similar to Example 1, the mixture of the composite board portion, the electronic parts, and the stainless steel particles was well separated and collected into each component.

Example 4

The same type of the waste printed circuit board as Example 1 was used in this Example. Zirconia particles of 5 mm size were injected onto the printed circuit board at an angle of 20 degrees to the board plane at an injection speed of 10 m/s in this particles collision operation for 10 min. The apparatus used was an injection tooling machine (Fuji Seisakusyo, Co., Ltd.). As the result, almost all electronic parts were disconnected from the composite board portion without fracture of the composite board portion. After that, using conveyer operation similar to Example 1, the mixture of the composite board portion, the electronic parts, and the zirconia particles was well separated and collected into each component.

As such, the present invention provides a method for separating electronic parts from waste printed circuit boards, wherein electronic parts are efficiently separated from waste printed circuit boards.

(4) Another embodiment of the present invention is described below with reference to the attached drawings.

First, a dry distillation apparatus used for metal-having resin treatment in accordance with the present invention is described with reference to FIG. 13.

Figure 13:
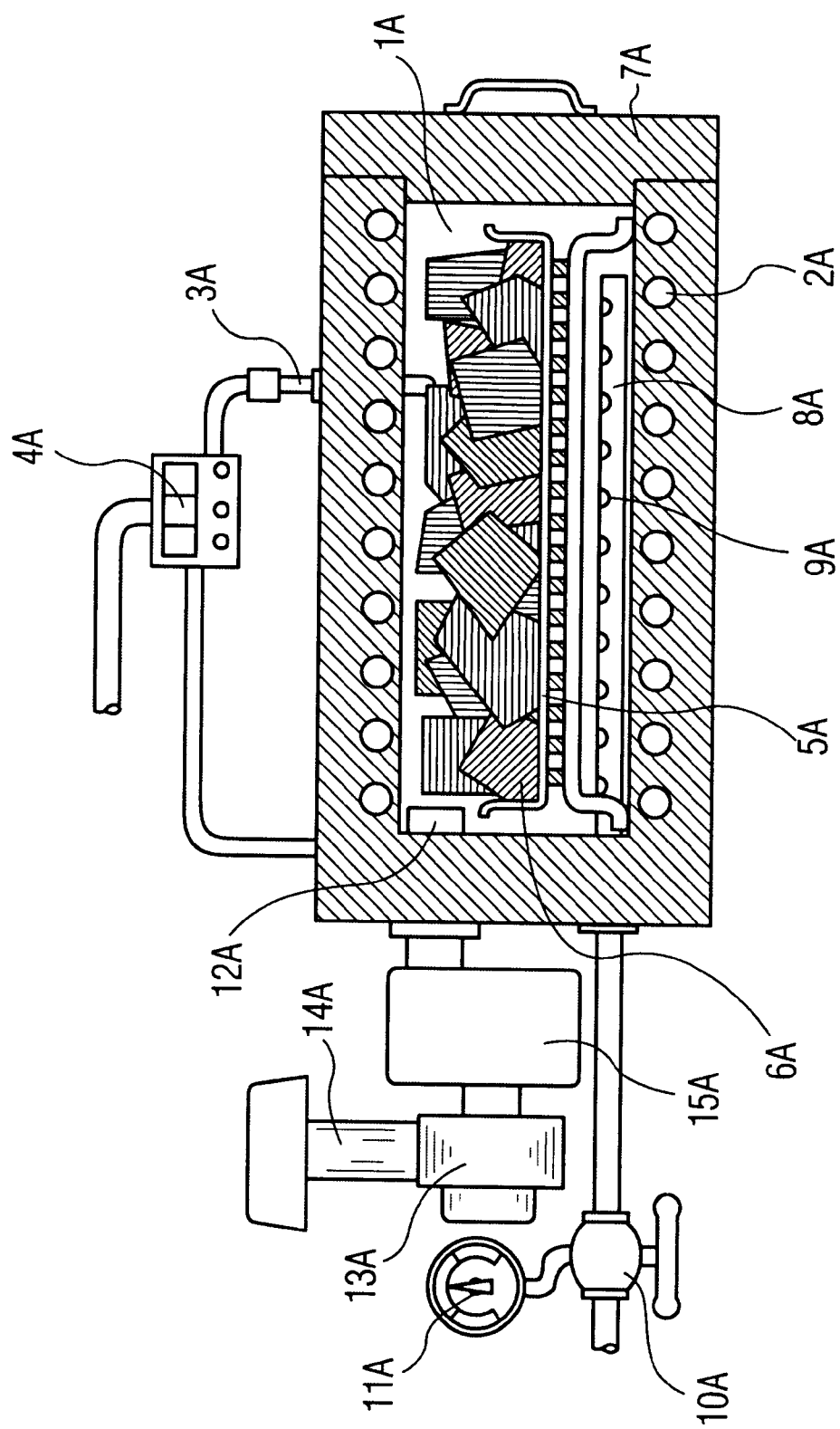
FIG. 13 is a schematic drawing of the configuration of a dry distillation apparatus used for metal-having resin treatment in accordance with a further embodiment of the present invention.

FIG. 13 is a schematic drawing of the configuration of a dry distillation apparatus used for metal-having resin treatment in accordance with the present invention. As shown in FIG. 13, heating furnace 1A, having a box shape, is equipped with an electric heater 2A embedded within the wall of the heating furnace 1A. Thermocouple 3A is a sensor for measuring temperature within the heating furnace 1A, and is connected to a temperature controller 4A, which controls the supplied voltage to the electric heater 2A depending on the temperature difference between the measured temperature and a set temperature. Treatment material 6A is of metal-having resin. Rack 5A is placed within the heating furnace 1A and carries the treatment material 6A. Door 7A of the heating furnace 1A can seal up the heating furnace 1A. Nitrogen gas piping 8A is connected to a nitrogen gas cylinder (not shown), and supplies injection of nitrogen gas through a plurality of injection holes 9A having openings to the heating furnace 1A. The present apparatus also comprises a control valve 10A and a pressure gauge 11A, both for the nitrogen gas. Scavenging fan 13A sucks and removes the gas generated from the heating furnace 1A, sucking through scavenging pipe 12A and exhausting through exhaust pipe 14A. Gas treatment tank 15A contains a scrubber and an active-carbon adsorbent tank, and locates between the scavenging pipe 12A and the scavenging fan 13A.

Operation of the dry distillation apparatus having the above-mentioned configuration, and used for metal-having resin treatment in accordance with the present invention is described below. The heating furnace 1A is temperature-controlled by the thermocouple 3A and the temperature controller 4A, and is set so that the temperature of the treatment material 6A is around 400° C. The treatment material 6A placed in the heating furnace 1A is epoxy printed circuit boards of non-incombustible grade retaining metallic material, such as solder, copper foil, resistors, and condensers thereon. The heating furnace 1A is sealed up by the door 7A, that is, external air does not flow in to the furnace.

In this situation, nitrogen gas is supplied to the nitrogen gas piping 8A from the nitrogen gas cylinder, not-shown. Then, the nitrogen gas is injected into the heating furnace 1A through the injection holes 9A. At the same time, the scavenging fan 13 draws gas from the heating furnace 1A through scavenging pipe 12A. Then, remaining air in the heating furnace 1A is replaced by the nitrogen gas, and hence, the heating furnace 1A has an oxygen-poor atmosphere inside.

In this oxygen-poor atmosphere, the treatment material 6A is heated up. And resin material, such as epoxy resin, contained in the treatment material 6A generates dry distillation gas by thermal decomposition without an oxidation reaction, or burning in the extreme case, of the treatment material 6A because of the oxygen-poor environment. The generated dry distillation gas is subsequently sucked from the heating furnace 1A and exhausted by the scavenging fan 13A. A part of the dry distillation gas is dissolved out while passing through the scrubber in the gas treatment tank 15A. The other part is removed in the active-carbon adsorbent tank in the gas treatment tank 15A. Therefore, clean exhaust gas (mainly, nitrogen gas), containing neither combustible component, odors, nor other harmful substances, passes through the scavenging fan 13A and the exhaust pipe 14A downstream.

After the above-mentioned operation has been continued for a predetermined time period, the control valve 9A is closed. At the same time, the scavenging fan 13A and the electric heater 2A are stopped, and then, the door 7A is opened. The resin being carbonized by removal of the dry distillation gas component is then obtained on the rack 5A. The metallic parts originally retained on the printed circuit boards still remain on the printed circuit boards.

At this time, the carbonized resin has lost its original toughness and is desirably brittle enough as to be easily finely pulverized with a small pulverizing force. Accordingly, the metallic parts attached on the printed circuit board are able to be easily removed and separated.

The treated treatment material 6A together with the rack 5A is removed from the heating furnace 1A. After pulverization, large metals, such as electronic parts and copper wires, can be separated up by classification separation. Finely pulverized component can be separated by a specific gravity separation method, such as air separation(a component is separated by air). According to such methods, metal component and carbide can be easily and precisely separated. The separated metals can be used economically as a raw metal material for smelting processes even in the case when the separated metals contain only a small amount of valuable metals, such as gold. Meanwhile, the separated carbide component contains little metal component and can be used as adsorbent material for sewage and sludge treatments as well as solid fuel or reduction treatment material. As such, according to the present invention, the metal-having resin can be recycled as useful raw materials in contrast to the previous difficulty to treat by conventional methods.

As described above, according to the dry distillation apparatus used for metal-having resin treatment in accordance with the present embodiment, metal component and carbide can be easily and precisely separated by screening or specific gravity separation after such treatment in which the metal-having resin is heated up in an oxygen-poor atmosphere and becomes brittle thereby. Furthermore, since the metal-having resin is heated up in an oxygen-poor atmosphere, the metal-having resin does not burn and hence does not reach an extremely high temperature. Therefore, evaporation and diffusion of metals is suppressed even in the case of low melting point metals, such as the lead component of solder, contained with the resin.

In the present embodiment, as long as the heating temperature of the treatment material 6A in the heating furnace 1A is controlled at 250° C. or higher, depending on the type of the resin, the resin portion reaches a brittle and easy-to-pulverize carbonized state without re-melting and re-solidifying of the metals co-existing with the resin. Resins generally used become brittle at temperature of 250° C. or higher and lower than 500° C. Accordingly, establishing temperature control at 250° C. or higher and lower than 500° C. is preferable for heating-energy saving. Note that this upper limit of 500° C. in the heating temperature comes from the fact that a part of low melting-point metals, such as solder, as well as the metal-having resin, melts and tends to evaporate and diffuse above the limit temperature. As the result, an additional exhaust treatment becomes necessary for such metals.

Another embodiment of the present invention is described below. A dry distillation apparatus used for metal-having resin treatment in accordance with present embodiment has a basic configuration similar to that of the preceding embodiment. However, in the present embodiment heating furnace 1A is not of the batch type having a seal-up mechanism. Entrance and exit for treatment material 6A are, by contrast, always open, and the treatment material 6A is conveyed on a moving platform. Description below is made with major attention to varied points.

Figure 14:
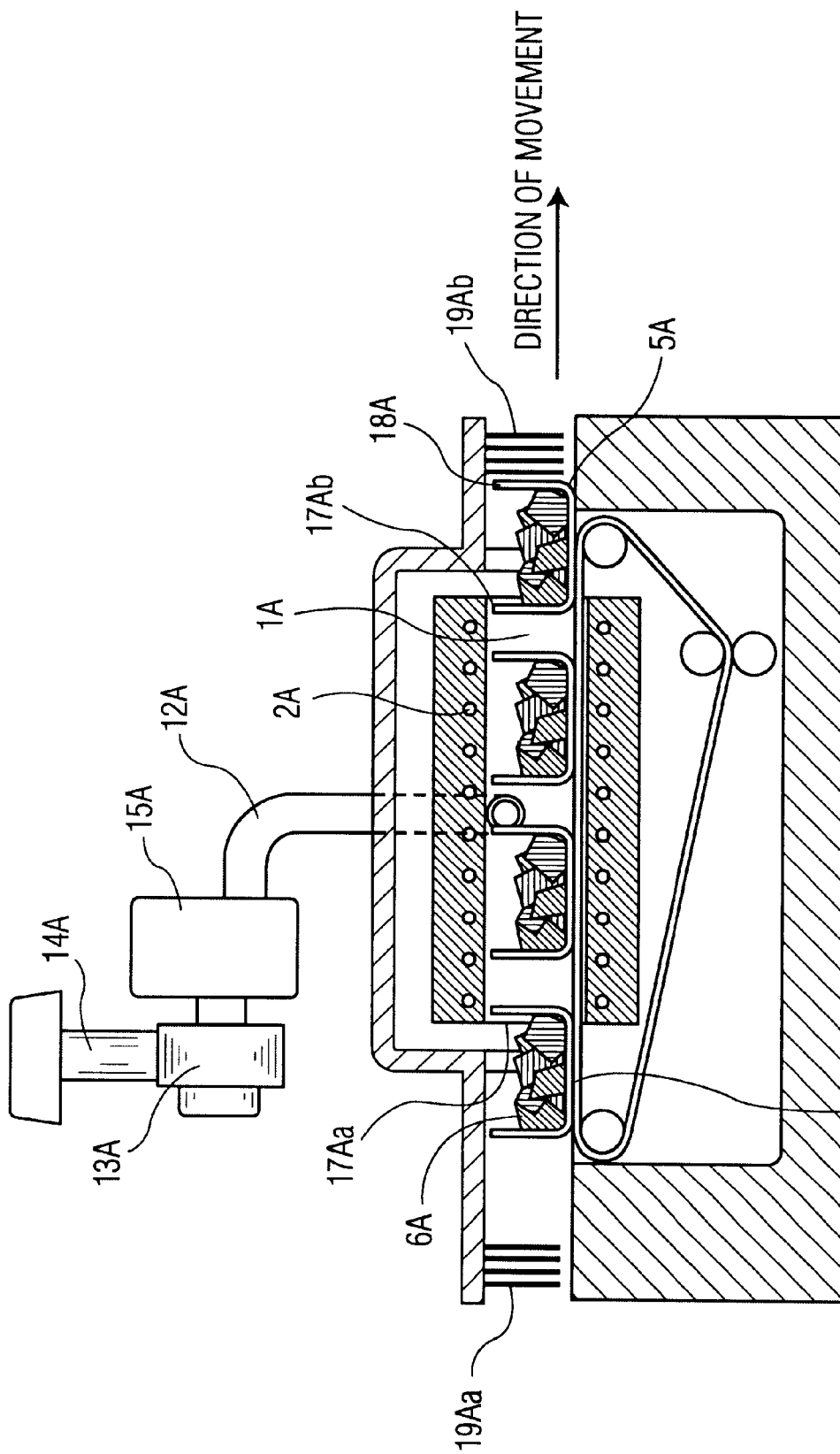
FIG. 14 is a schematic drawing of the configuration of a dry distillation apparatus used for metal-having resin treatment in accordance with another embodiment of the present invention.

FIG. 14 is a schematic drawing of the configuration of a dry distillation apparatus used for metal-having resin treatment in accordance with the present embodiment. As shown in FIG. 14, a dry distillation apparatus used for metal-having resin treatment in accordance with the present embodiment comprises entrance 17Aa and exit 17Ab always open to the outside of heating furnace 1A, and also comprises a conveying means 16A having a metal-mesh belt moving (in the direction of the arrow shown in the FIG. 14) through the heating furnace 1A via the entrance and exit. The entrance 17Aa and the exit 17Ab comprise flexible sheets 19A in each outer vicinity of the heating furnace 1A. Rack 5A carried on the conveying means 16A has gas diffusion suppression walls 18A as front and rear walls relative to the direction of movement.

Operation of the dry distillation apparatus having the above-mentioned configuration, and used for metal-having resin treatment in accordance with the present embodiment is described below. The rack 5A carrying treatment material 6A is put into the entrance 17Aa through the flexible sheets 19Aa. Then, the rack 5A automatically moves through the heating furnace 1A by the conveying means 16A. The treatment material 6A carried on the rack 5A is treated by dry distillation in a similar procedure to the preceding embodiment, until the rack 5A automatically moves out of the heating furnace 1A through the exit 17Ab and through the flexible sheets 19Ab.

In the case when the treatment material 6A is phenol printed circuit boards of non-incombustible grade containing flame retardant, and is assembled with electronic parts, decomposition gas of the flame retardant surrounds the printed circuit boards during the heating-up of the printed circuit boards by the heating furnace 1A. And hence, the atmosphere around the printed circuit boards becomes oxygen-poor. Accordingly, the resin component contained in the printed circuit boards can become brittle without burning of the printed circuit boards even in the case that the atmosphere within the heating furnace 1A is an oxygen-rich gas such as air. As such, in the case that the metal-having resin contains flame retardant, surroundings of the metal-having resin can be kept oxygen-poor even in an oxygen-rich atmosphere outside, and hence, extra supply of an inert gas, such as nitrogen, is unnecessary. This situation gives an advantages in economy.

Since the flexible sheets 19Aa, 19Ab are covering the majority of the opening (i.e., the entrance 17Aa and the exit 17Ab) of the heating furnace 1A, the flexible sheets 19Aa, 19Ab suppress the leakage of dry distillation gas from the openings of the apparatus without disturbing the conveyance of the rack 5A carrying the treatment material 6A.

Since the gas diffusion suppression walls 18A are covering the majority of the opening cross-section of the heating furnace 1A in the direction of the movement of the rack 5A, the gas diffusion suppression walls 18A suppress the dry distillation gas generated from the treatment material 6A to escape through the opening (i.e., the entrance and exit) of the heating furnace 1A.

As such, the present embodiment realizes a dry-distillation treatment apparatus having an excellent advantage in operation, wherein the continuous carbonizing operation is achieved by putting the treatment material 6A on the conveying means 16A.

In the present embodiment, flexible sheets 19Aa, 19Ab of glass fabric/fluororesin can be used keeping both heat resistance and flexibility as long as the temperature in the place where the flexible sheets locate does not exceed around 250° C. In the case of temperature exceeding 250° C., metallic sheets, such as of stainless steel, copper, or aluminum are used.

In the configuration of the present embodiment, the treatment material 6A in a high temperature can be carried out from the heating furnace 1A because the treatment material 6A is continuously dry-distilled. In that case, a cooling means for rapidly cooling the heated treatment material 6A may be located in the vicinity following the heating furnace 1A. According to this method, the treatment material 6A can be safely and rapidly treated in separation process without danger of ignition by exposing the material at high temperature to the air, and without another danger of burn. The cooling means includes a method by spraying a low-temperature gas or liquid directly onto the treatment material 6A, and a method by contacting cooled sheets or rolls to the treatment material 6A.

Furthermore, the scavenging hole of the scavenging pipe 12A may be located near the place where the treatment material 6A reaches its thermal-decomposition temperature and generates dry distillation gas while the treatment material 6A carried on the rack 5A conveyed by the conveying means 16A is heated up during the passage through the heating furnace 1A. In that case, the dry distillation gas is efficiently scavenged, and the leakage of the dry distillation gas through the opening (i.e., the entrance and exit) of the heating furnace 1A is suppressed.

Moreover, the apparatus may be equipped with a heat medium channel for cooling a part of the flexible sheets 19Ab. In this case, the heated treatment material 6A, after the dry distillation, sufficiently contacts with the flexible sheets 19Ab when the treatment material 6A is carried out to the exit. The treatment material 6A is efficiently cooled by this contact with the flexible sheets 19Ab, wherein efficient heat exchange occurs with the heat medium channel.

Yet another embodiment of the present invention is described below. A dry distillation apparatus used for metal-having resin treatment in accordance with present embodiment has a basic configuration similar to that of the preceding embodiment. However, the present embodiment includes a means for including an after-treatment operation as treatment material 6A is carried out from heating furnace 1A. A variety of points are noted in the description below.

Figure 15:
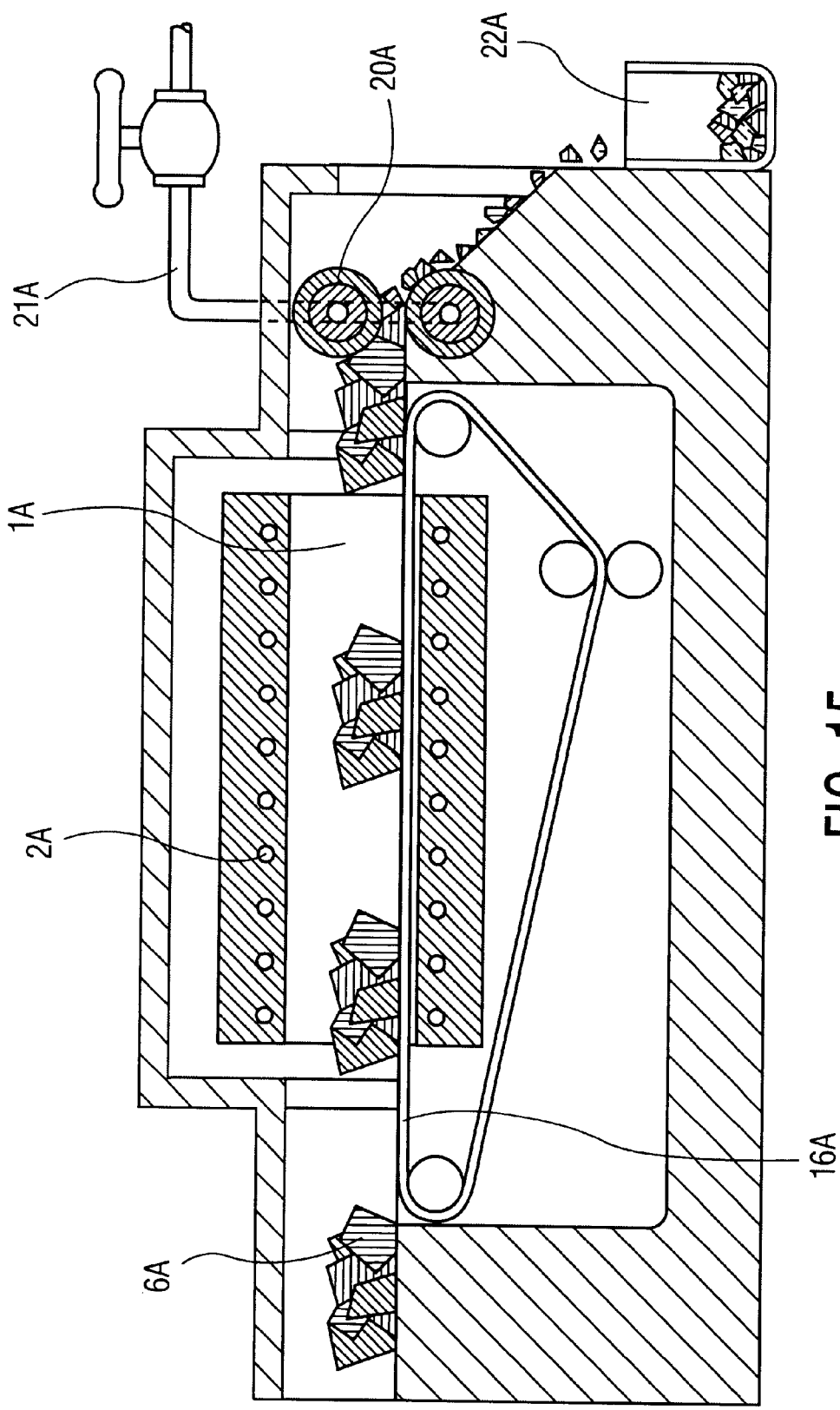
FIG. 15 is a schematic drawing of the configuration of a dry distillation apparatus used for metal-having resin treatment in accordance with still another embodiment of the present invention.

FIG. 15 is a schematic drawing of the configuration of the main part of a dry distillation apparatus used for metal-having resin treatment in accordance with the present embodiment. As shown in FIG. 15, a dry distillation apparatus used for metal-having resin treatment in accordance with the present embodiment comprises shredding rolls 20A for pressing and shredding of treatment material 6A after it is carbonized and brittle. The shredding rolls 20A are located in the vicinity of conveying means 16A working through heating furnace 1A dowstream of the furnace. The shredding rolls 20A are connected to a cooling water pipe 21A which supplies cooling water to the rolls. The present apparatus comprises a collection basket 22A for collecting shredded pieces downstream of the shredding rolls 20A.

Operation of the dry distillation apparatus having the above-mentioned configuration and used for metal-having resin treatment in accordance with the present embodiment is described below. The resin portion of the treatment material 6A treated by dry distillation in the heating furnace 1A is carbonized and so brittle as to be easily shredded with a small pressing force. Accordingly, the carbonized resin portion is easily shredded and pulverized when the treatment material 6A is wound between and pressed by the shredding rolls 20A rotating in the vicinity of the exit of the heating furnace 1A. Metallic parts co-existing with the carbonized resin portion are separated or peeled in this process, and drop into the collection basket 22A together with the carbonized resin portion.

The fractured pieces collected in the collection basket 22A can be easily and rapidly separated into carbonized resin and metals by classifing separation or air separation, without any other pulverizing means.

As such, the present embodiment realizes a dry-distillation treatment apparatus performing continuous shredding process for more efficient subsequent separation process, wherein the continuous shredding process is performed by means of the shredding rolls 20A for shredding the treatment material treated by dry distillation.

In the present embodiment, the shredding rolls 20A may be supplied with cooling water through the cooling water pipe 21A. In this case, the treatment material 6A, if heated, right after carried out from the heating furnace 1A can be cooled down by the shredding rolls 20A as well.

Although, an electric heater was used as the heating means in each embodiment of the present invention, the heating means in accordance with the present invention is not restricted to this. The heating means includes the use of heat of combustion of a pipelined gas fuel, such as city gas and propane gas, or a liquid fuel such as kerosene. For the use of heat of combustion, an air supplying means, such as an air blower, is added for the combustion, if necessary. For the use of a liquid fuel, in particular, a means for vaporizing the liquid fuel is added upstream of the heating means (i.e., combustion section).

A method for treating dry distillation gas, performed in gas treatment tank 15A, includes a flame combustion, catalytic combustion and catalytic oxidation. The last two reactions use a catalyst. The present invention is not restricted to a specific material or shape of the catalyst, and includes, for example, sintered ceramics and metals; metal honeycomb structures and fabrics; and knitting of ceramic fibers. The present invention also includes, for example, curved, cylindrical, and wavy shapes as well as flat shape. Such shape of the catalyst may be selected arbitrarily, depending on the workability of material and the application. Regarding the active component of the catalyst, the present invention includes, for example, platinum-group noble metals generally used as catalysts, such as platinum, palladium, and rhodium; a mixture of these noble metals; other metals and their oxides; and a mixture of these. The catalyst material may be selected arbitrarily, depending on the type of fuel and the condition of use.

To keep the surroundings of metal-having resin to be oxygen-poor, nitrogen atmosphere is generally used as described previously. In addition, other inert gas, such as carbon dioxide, helium, and argon, may be used. The present invention is not restricted to a specific gas atmosphere as long as such gas atmosphere prevent the metal-having resin from burning. For example, in the case that the metal-having resin contains flame retardant as described in the preceding embodiment, oxygen-poor condition can be achieved during the heating treatment even in a oxygen-containing atmosphere because decomposition gas from the flame retardant surrounds the metal-having resin. Furthermore, reducing the scavenging rate so that the dry distillation gas generated from the metal-having resin remains to surround the metal-having resin, the surroundings of the metal-having resin can be kept oxygen-poor.

Metal-having resin to be treated in accordance with the present invention is any and every resin material having metals. Such metal-having resins include, for example, a printed wiring board having copper wiring patterns, and such printed wiring board further being assembled with electronic parts. Note that the printed circuit board or, simply, circuit boards in this specification generically include these printed wiring boards. Furthermore, metal-having resin to be treated in accordance with the present invention includes parts and components containing metal-having resin. Examples of such a component include motors or transformers molded from resin therein.

The temperature measuring means may be a thermocouple. However, temperature measuring means in accordance with the present invention is not restricted to this. For example, a thermistor may be used, and any number of the temperature measuring means may be equipped anywhere. Further, the controlling means for controlling the heating power in cooperation with the temperature measuring means, controls voltage for electric heating, and controls supply rates of fuel and air for combustion heating. The scavenging means is generally a fan, but may be a pump, if necessary for pressure or suction power.

The conveying means may be a moving belt made of a heat-resisting material such as metal. However, conveying means in accordance with the present invention are not restricted to this. For example, a series of rotating rods (rollers) may be used. The driving means for driving the conveying mean is generally an electric motor.

The gas treatment means may be a scrubber spraying an absorbing liquid into the dry distillation gas, or an active-carbon adsorbent tank containing an adsorbent for adsorbing the dry distillation gas. However, gas treatment means in accordance with the present invention are not restricted to this. For example, a bubbling tank for spouting the dry distillation gas through an absorbing liquid may be used. Further, these means may be used in combination. Moreover, other possible gas treatment means are a decomposition reactor for dry distillation decomposition reaction, a combustion reactor using flame or catalytic combustion, and a catalytic reactor containing decomposition catalyst to react even with a thin gas. The gas treatment means may be selected arbitrarily, depending on the condition of use and the handling convenience.

As such, the present invention provide an apparatus for treating and carbonizing metal-having resin by dry distillation and for allowing easy separation of metals and resin carbide.

A still further embodiment of the present invention is described below with reference to the attached drawings.

There is shown heating means of a heating furnace, a controlling means of the temperature within the heating furnace, a scavenging means, a supplying and controlling means of air and fuel, a measuring means of catalyst temperature, a conveying configuration for waste, and a driving means of the conveying configuration. The heating means includes an electric heater, and a combustion-type heating unit using a liquid or gas fuel. Temperature measuring means for measuring the temperature within the dry distillation furnace and the temperature of the catalyst is any number of thermocouples or thermistors placed anywhere. The supplying and controlling means of air and fuel for controlling the heating power in cooperation with the temperature measuring means controls the electric valve and air blower. The scavenging means is generally a fan, but may be a pump, if necessary for pressure or suction power reasons. The conveying means may be a moving heat-resisting metallic belt or a series of rotating rods (rollers). The driving means for driving the conveying mean is generally an electric motor. These means are conventional ones, and other means known in the art may be used. Thus, the technical description on these means is omitted in this specification.

A dry distillation apparatus used for waste treatment in accordance with the present invention is described with reference to FIG. 16.

Figure 16:
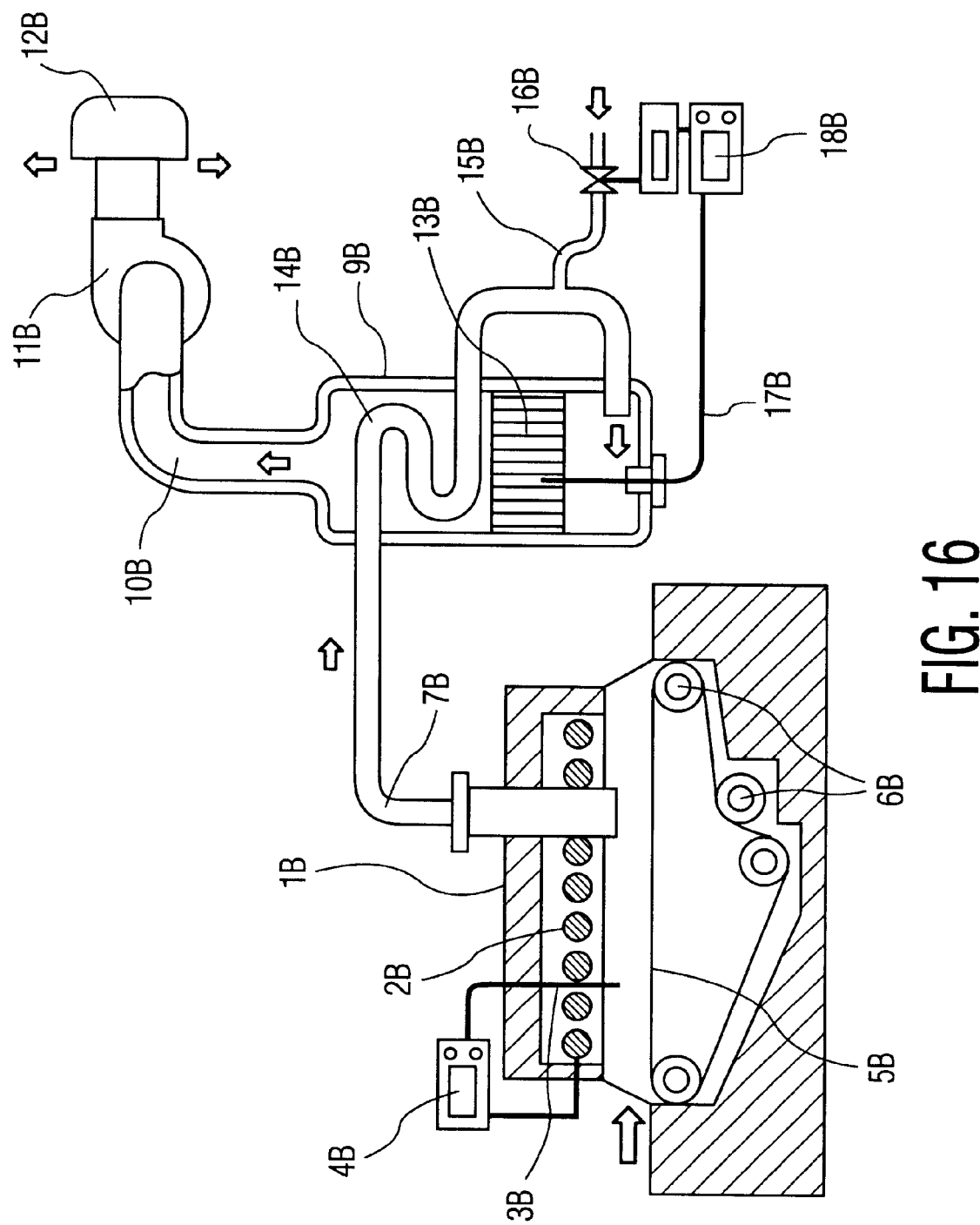
FIG. 16 is a schematic drawing of the configuration of a dry distillation apparatus used for waste treatment in accordance with yet another embodiment of the present invention.

FIG. 16 is a schematic drawing of the configuration of a dry distillation apparatus used for waste treatment in accordance with the present embodiment. As shown in FIG. 16, heating furnace 1B having a tunnel-like shape is equipped with an electric heater 2B embedded within the wall of the heating furnace 1B. Furnace temperature sensor 3B is a sensor for measuring temperature within the heating furnace 1B, and is connected to a temperature controller 4B, which controls the supplied voltage to the electric heater 2B depending on the difference between the measured temperature and a set temperature. Conveying belt 5B is a metal-mesh belt for conveying waste, and placed within the heating furnace 1B. Roller parts 6B drive the conveying belt 5B. Scavenging pipe 7B has a tip opening inside the heating furnace 11B, and sucks and exhausts dry distillation gas. The scavenging pipe 7B is connected through a gas purifying part 9B, an exhaust pipe 10B, and an exhaust fan 11B downstream. The exhaust fan 11B has an exhaust top 12B downstream. The gas purifying part 9B contains an oxidizing catalyst 13B having a ceramic honeycomb structure carrying an oxidation-active component of a combustible organic material. In the inner space of the gas purifying part 9B, heat exchanging part 14B surrounding the scavenging pipe 7B is located downstream of the oxidizing catalyst 13B. Fuel pipe 15B supplies a fuel gas (LP gas, in this embodiment), and the fuel flow rate is controlled by a fuel control valve 16B. Catalyst temperature sensor 17B contacts to the oxidizing catalyst 13B, and sends a signal to a combustion controller 18B. Subsequently, the combustion controller 18B generates a signal to control the fuel control valve 16B.

Operation and action of the present embodiment is described below. The heating furnace is voltage-controlled to attain an in-furnace temperature of around 400° C. by the temperature controller 4B based on the temperature measured at the furnace temperature sensor 3B. Waste containing large amount of organic material, such as waste printed circuit boards, garbage, fish/vegetable offal and so on, is put into the heating furnace 1B. The waste is carried on the conveying belt 5B driven by the roller parts 6B, and moves through the inside of the heating furnace 1B. Water vapor and thermal decomposition substances yield from the waste as the temperature rises. These generated gasses (dry distillation gasses) are sucked by the scavenging fan 11B, and exhausted through the scavenging pipe 7B. The dry distillation gas flowing in the scavenging pipe 7B is supplied to the gas purifying part 9B, and rapidly purified by oxidation. Note that the temperature of oxidizing catalyst 13B with fuel gas supplied through fuel pipe 15B is generally already high enough for the oxidation to occur. The initial heating-up of the oxidizing catalyst 13B is accomplished using the fuel gas supplied from the fuel pipe 15B. After the oxidizing reaction, the exhaust gas flows through the exhaust pipe 10B, the exhaust fan 11B, and the exhaust top 12B, and then escapes to the air.

Hot exhaust gas is generated downstream of the oxidizing catalyst 13B. However, the heat is collected by the heat exchanging part 14B surrounding the scavenging pipe 7B, and hence, cooled exhaust gas reaches at the exhaust fan 11B while dry distillation gas is pre-heated and ready-to-react before being supplied to the oxidizing catalyst 13B. Therefore, perfect oxidation of the dry distillation gas is easily achieved even if the dry distillation gas contains difficult-to-oxidize components. The temperature of the oxidizing catalyst 13B is continuously measured by the catalyst temperature sensor 17B, and, if the temperature of oxidizing catalyst 13B is below a predetermined value, the fuel control valve 16B is opened by the combustion controller 18B to supply more fuel. In the case when the temperature of oxidizing catalyst 13B is greater than a predetermined value due to more heat of combustion from the dry distillation gas, the fuel control valve 16B is throttled to reduce the fuel. As such, the temperature of oxidizing catalyst 13B is always kept optimal.

The air (oxygen) which is necessary for the oxidation of fuel and dry distillation gas on the oxidizing catalyst 13B is introduced at sufficiently rate through the scavenging pipe 7B together with the dry distillation gas because entrance and exit for the conveying belt 5B of the heating furnace 1B are open to the air. Thus extra air supply is unnecessary. The amount of dry distillation gas generated and, especially, the combustible gas content of the dry distillation gas can substantially vary depending on the sort, quantity, and condition (variances in water content, compression, etc.) of the input waste. However, catalytic reaction using the oxidizing catalyst 13B can achieve substantially perfect reaction even for a thin gas, as long as the necessary catalyst temperature is maintained, and hence, production of unburned or intermediate substances may be prevented.

Figure 17:
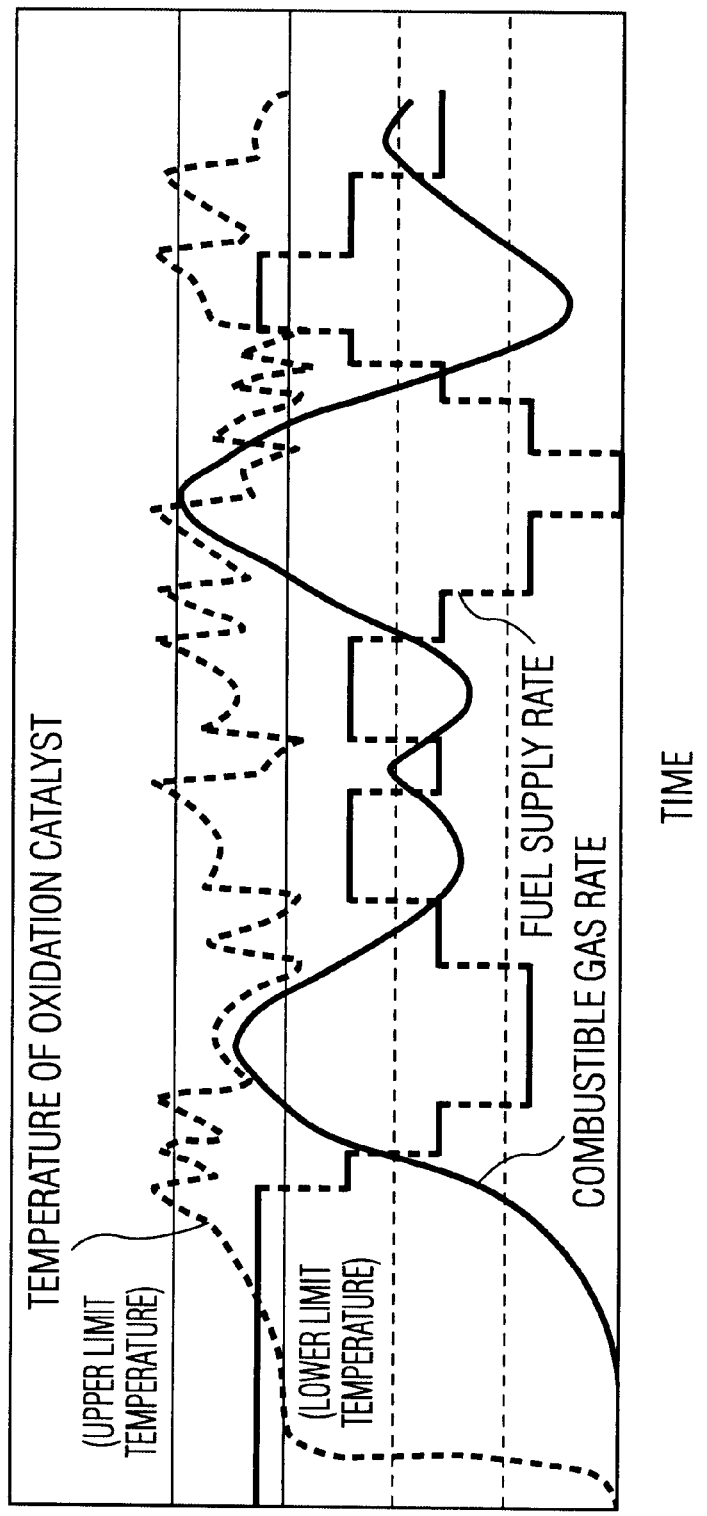
FIG. 17 is an illustration of the working characteristics of the above-mentioned apparatus.

FIG. 17 shows an example of the working characteristics of the present apparatus in actual operation. The rate of combustible gas yielded from waste shown by (solid line) varies remarkably in time. However, the fuel supply rate is stepwise controlled by the temperature of the oxidizing catalyst 13B, and thus the temperature is maintained within the necessary and sufficient temperature range for working. Therefore, detection and identification of amount or sort of the dry distillation gas, which is a mixture of various kinds of components, is unnecessary for maintaining clean exhaust gas. The coarse control of the fuel gas depending on the temperature of the oxidizing catalyst 13B alone is sufficient.

Various contaminating materials in waste are expected. In particular, contamination by chlorides (including cooking salt and the like) and halides (including plastics pieces and the like) can yield harmful dioxins in the temperature range of around 300–700° C.

Consequently, it is disirable to maintian the temperature of the oxidizing catalyst 13B at 800° C. or higher, so that the dioxins are thermally decomposed, and hence, the release of dioxins prevented. Since the temperature decreases rapidly down to 300° C. or lower downstream of the oxidizing catalyst 13B due to the action by the heat exchanging part 14B, regeneration of the dioxins from their decomposition gas is also prevented. The upper limit temperature is limited by the heat resistant temperature of the oxidizing catalyst 13B, and is generally 1,000° C. or lower. Since the exhaust gas is clean and perfectly oxidized, the exhaust gas can be, if necessary, further cooled down to 200° C. of lower by equipping an water-cooled heat exchanger downstream of the gas purifying part 9B.

Since residue after the release of dry distillation gas is carbonized, and has a reduced volume of one seventh to one fourth of the initial volume, substantial reduction in volume is achieved even when the remnant is disposed in this form. Furthermore, such residue can be used as land improvement material and fertilizer, or adsorbent material for sewage and sludge treatments, as well as solid fuel or reduction treatment material. As such, according to this embodiment of the present invention, waste that is difficult to treat by conventional methods can be recycled into useful raw materials.

A further embodiment of the present invention is described below. A dry distillation apparatus used for waste treatment in accordance with the present embodiment has basic configuration and operation both similar to those of the dry distillation apparatus used for waste treatment of the preceding embodiment. However, in the present embodiment control of atmosphere conditions within heating furnace 1A, and air supplying means to the dry distillation gas are different from those of the preceding embodiment. The description below is made with major attention to these varied points.

Figure 18:
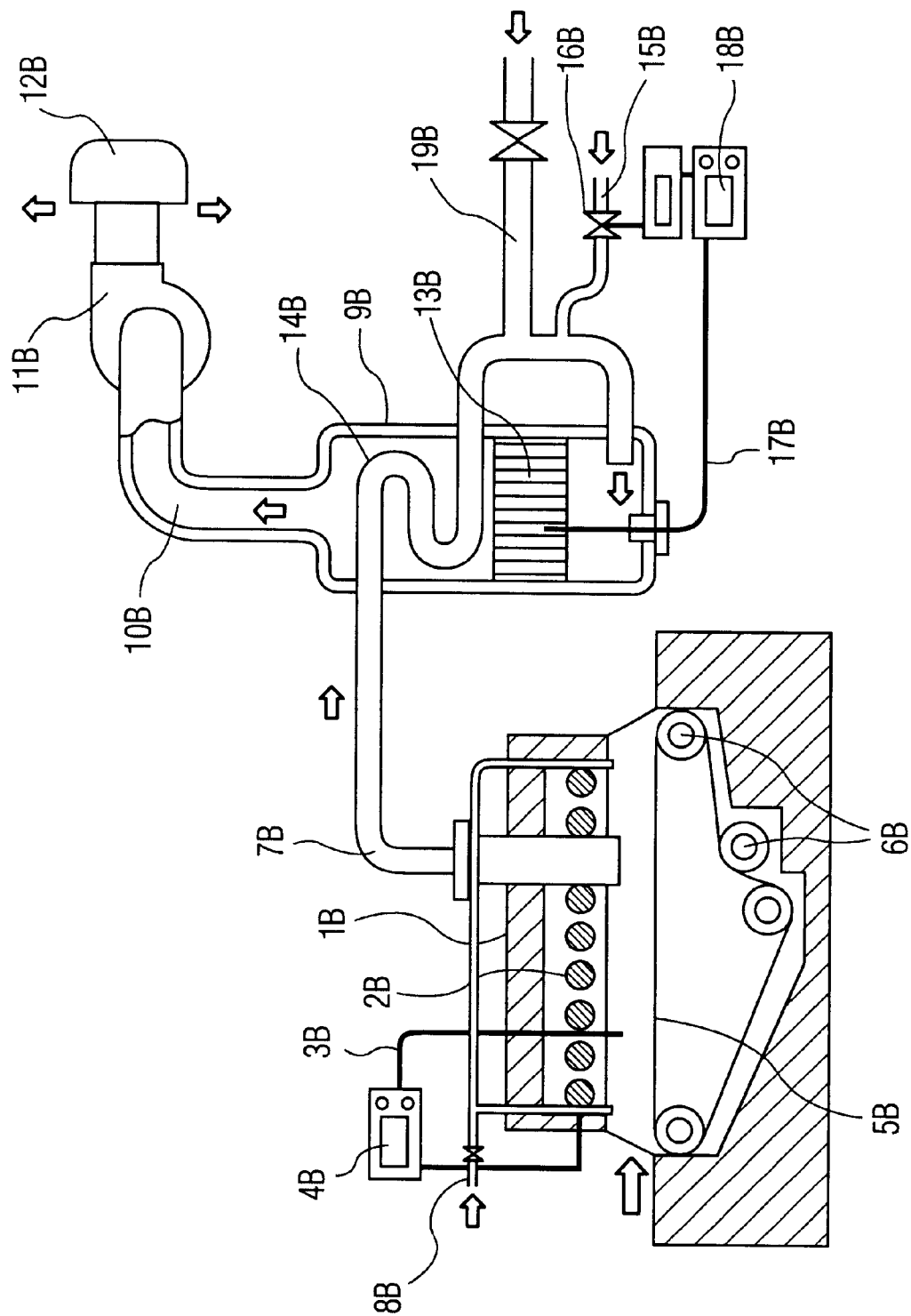
Figure 19:
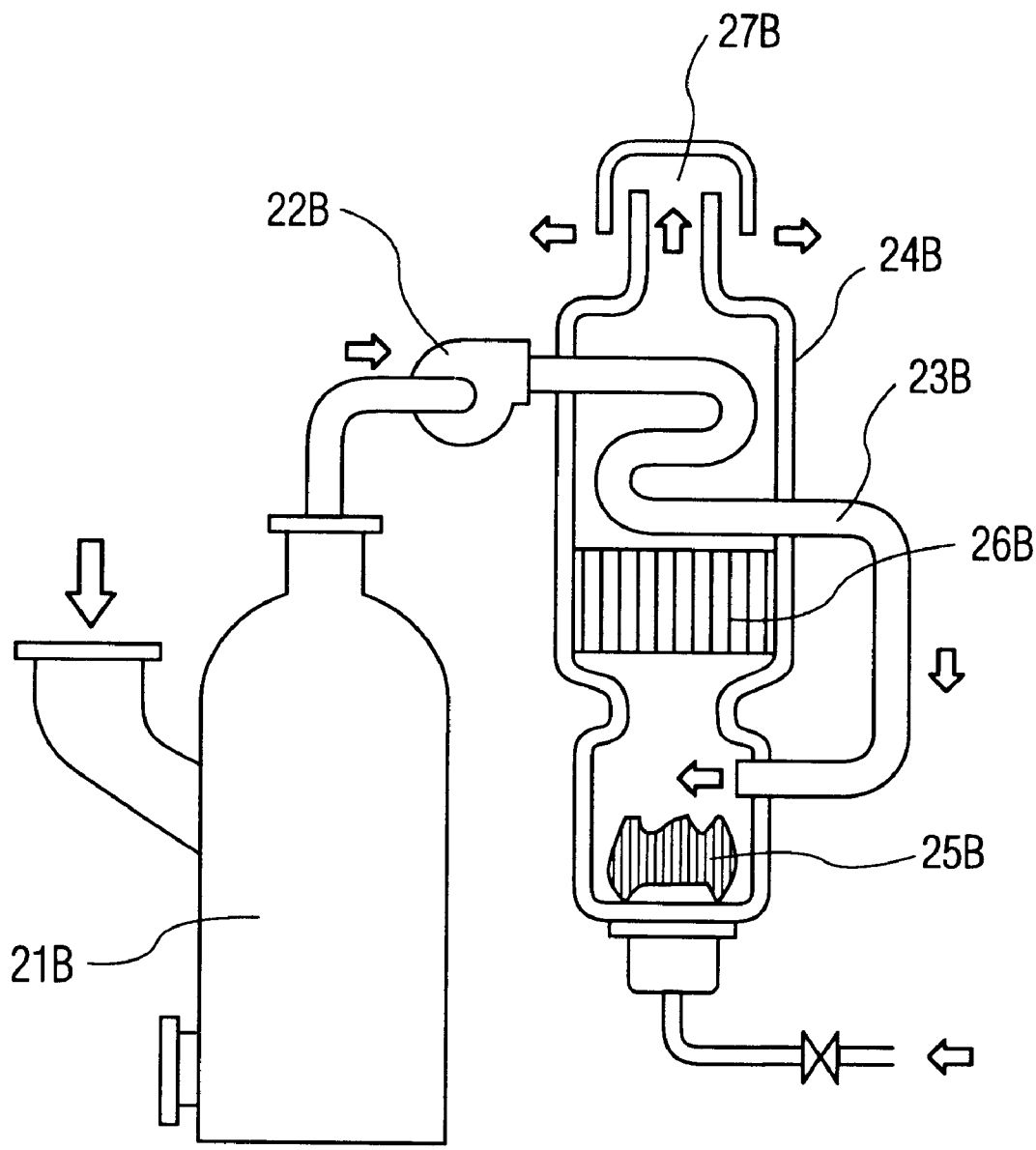
FIG. 19 is a schematic drawing of the configuration of a prior art apparatus used for waste treatment.

FIG. 18 is a schematic drawing of the configuration of a dry distillation apparatus used for waste treatment in accordance with the present embodiment. As shown in FIG. 18, admission pipe 8B for the nitrogen gas supply is equipped in the vicinity of both the entrance and the exit of heating furnace 1B. The admission pipe 8B supplies nitrogen gas at a rate exceeding the rate of dry distillation gas sucked and exhausted through scavenging pipe 7B. Air supplying pipe 19B is connected upstream of gas purifying part 9B, together with fuel pipe 15B.

In this configuration, waste is heated up within the heating furnace 1B filled with nitrogen gas, and hence, danger of, ignition due to such reaction with the gas generated by heating-up is prevented. Further, oxidative polymerization within the heating furnace 1B is suppressed, and generation of dioxins is prevented. Since the dry distillation gas produced here contains no air (oxygen) necessary for oxidation reactions, the air supplying pipe 19B must mix a sufficient amount of air into the dry distillation gas upstream of the gas purifying part 9B for complete oxidation. Then, the dry distillation gas becomes a combustible mixture, and oxidation can occur on oxidizing catalyst 13B. The air supply is necessarily introduced at a rate exceeding that of the expected maximum combustible gas generated form the heating furnace 1B. Because of the wide tolerable range of combustible gas content for the reaction of the oxidizing catalyst 13B, the air supply is not necessarily finely controlled and, depending on the combustion condition, may be at a constant excess.

The gas supplied into the heating furnace 1B through the admission pipe 8B is for reducing the oxygen concentration. Thus, the use of a pure gas, such as nitrogen, is not necessary as long as the requirement is achieved. For example, the exhaust gas which has low oxygen concentration, may be used by recycling the gas from exhaust pipe 10B. This configuration realizes simplicity and economy without altering the advantages of this embodiment of the present invention.

Although the present invention is described in the embodiment of a dry distillation apparatus used for waste treatment using electric heating, the present invention is obviously not restricted to this. The advantages of the present invention are also achieved in the following alternatives.

The heating means may be the combustion of a pipelined gas fuel, such as city gas and propane gas, or a liquid fuel such as kerosene. For the use of heat of combustion, an air supplying means, such as an air blower, is added for the combustion, if necessary. For the use of a liquid fuel, in particular, a means for vaporizing the liquid fuel is added upstream of the heating means (i.e., combustion section).

Regarding the configuration of the oxidizing catalyst 13B equipped in the gas purifying part 9B, a base material of ceramic honeycomb structure is used in the embodiment. However, the present invention is not restricted to a specific material or shape of the catalyst, and includes, for example, sintered ceramics and metals; metal honeycombs structure or metal fabrics; knitting of ceramic fibers and so on. The present invention also includes, for example, curved, cylindrical, wavy shapes, and so on as well as a flat shape. The shape of the catalyst may be selected arbitrarily, depending on the workability of material and the application. Regarding the active component of the catalyst, the present invention includes, for example, platinum-group noble metals generally used as catalysts, such as platinum, palladium, rhodium, etc.; a mixture of these noble metals; other metals and their oxides; and a mixture of these. The catalyst material may be selected arbitrarily, depending on the type of fuel and the condition of use.

As such, the present invention provide an apparatus for waste treatment, whereby waste containing combustible organic material is dry-distilled and carbonized to have a reduced weight, further the carbonized product obtained can be widely used as recycled materials, and wherein dry distillation gas generated is perfectly cleaned up by oxidation to become a clean exhaust gas.

What is claimed is:

1. A method for treating waste printed circuit boards, the method comprising the steps of:
   heating up for dry-distilling the waste printed circuit boards having copper foil retaining solder in at least a part of the surface, at a temperature of 250° C. or higher;
   pulverizing the dry-distilled material of said waste printed circuit boards obtained in said heating step; and
   separating the pulverized material of said waste printed circuit boards obtained in said pulverizing step, into board resin component and metal component.

2. A method for treating waste printed circuit boards according to claim 1, wherein said pulverizing step is performed avoiding that said solder is finely cut to the particle size less than 100 $\mu$m.

3. A method for treating waste printed circuit boards according to claim 1, wherein said pulverizing step is performed by a ball mill pulverization using pulverization media having lower surface hardness than that of solder.

4. A method for separating metallic material from waste printed circuit boards, the method comprising the steps of:
   heating up the waste printed circuit boards having at least metallic material, in an atmosphere avoiding the burning of the printed circuit board portion of said waste printed circuit boards or in an atmosphere avoiding the oxidation of said metallic material, so that the temperature of at least said printed circuit board portion becomes 250° C. or higher and lower than 500° C.;
   pulverizing the substantial printed circuit board portion alone of said waste printed circuit boards heated-up in said heating step into pieces not exceeding a predetermined size; and
   separating the pulverized pieces of said substantial printed circuit board portion pulverized in said pulverizing step and said metallic material retained on said waste printed circuit boards, depending on the difference in the sizes of said pulverized pieces and of said metallic material.

5. A method for separating metallic material from waste printed circuit boards according to claim 4, wherein said heating step is performed so that said temperature of at least said printed circuit board portion becomes 350° C. or higher.

6. A method for separating metallic material from waste printed circuit boards according to claim 5, the method comprising the step, after said heating step, of cooling said waste printed circuit boards heated-up in said heating step; and
   wherein the substantial printed circuit board portion of said waste printed circuit boards cooled in said cooling step is pulverized in said pulverizing step.

7. A method for separating metallic material from waste printed circuit boards according to claim 6, wherein said cooling step is performed in an atmosphere avoiding the burning of the printed circuit board portion of said waste printed circuit boards or in an atmosphere avoiding the oxidation of said metallic material of said waste printed circuit boards.

8. A method for separating metallic material from waste printed circuit boards according to claim 7, the method comprising the step of immersing said waste printed circuit boards having at least metallic material, before the heating step, into a decomposition liquid containing at least one of ethylene glycol, propylene glycol, diethylene glycol, dipropylene glycol, isopropylene glycol, and sodium hydroxide solution.

9. A method for separating metallic material from waste printed circuit boards according to claim 8, the method comprising the steps of:

providing a belt conveyer moving upward and inclined relative to the horizontal plane;

supplying said metallic material separated in said separating step, onto said belt conveyer;

collecting a part of said metallic material each of said part having a shape which makes itself easily dropped, at bottom of said belt conveyer, in a metal collecting process; and collecting another part of said metallic material each of said part having a shape which makes itself hardly dropped, on top of said belt conveyer, in said metal collecting process.

10. A method for treating waste printed circuit boards according to claim 8, the method comprising the step of heating up said pulverized pieces of said substantial printed circuit board portion separated in said separating step, in an atmosphere avoiding the burning of said pulverized pieces, so that the temperature of at least said pulverized pieces become 350° C. or higher, in a heat and remove process; thereby removing said flame retardant from said pulverized pieces in said heat and remove process.

11. A method for treating waste printed circuit boards according to claim 8, the method comprising the step of dissolving out the heavy metals from said pulverized pieces by allowing said pulverized pieces of said substantial printed circuit board portion separated in said separating step to contact with water in this dissolve-out process.

12. A method for separating metallic material from waste printed circuit boards, the method comprising the steps of:

heating up the waste printed circuit boards having at least metallic material, in an atmosphere avoiding the burning of the printed circuit board portion of said waste printed circuit boards or in an atmosphere avoiding the oxidation of said metallic material, so that the temperature of at least said printed circuit board portion becomes 250° C. or higher and lower than 500° C.;

pulverizing the substantial printed circuit board portion of said waste printed circuit boards heated-up in said heating step, by colliding predetermined particles at said waste printed circuit boards; and separating the pulverized pieces of said substantial printed circuit board portion pulverized in said pulverizing step and said metallic material retained on said waste printed circuit boards, depending on the difference in the sizes of said pulverized pieces and of said metallic material.

13. A method for separating metallic material from waste printed circuit boards according to claim 12; wherein said pulverizing step is performed by putting said heated-up waste printed circuit boards and said particles in a container, and by rotating and/or vibrating said container, and further by colliding said particles at said waste printed circuit boards.

14. A method for separating metallic material from waste printed circuit boards according to claim 13, wherein said heating step is performed so that said temperature of at least said printed circuit board portion becomes 350° C. or higher.

15. A method for separating metallic material from waste printed circuit boards according to claim 14, the method comprising the step, after said heating step, of cooling said waste printed circuit boards heated-up in said heating step; and wherein the substantial printed circuit board portion of said waste printed circuit boards cooled in said cooling step is pulverized in said pulverizing step.

16. A method for separating metallic material from waste printed circuit boards according to claim 15, wherein said cooling step is performed in an atmosphere avoiding the burning of the printed circuit board portion of said waste printed circuit boards or in an atmosphere avoiding the oxidation of said metallic material of said waste printed circuit boards.

17. A method for separating metallic material from waste printed circuit boards according to claim 16, the method comprising the step of immersing said waste printed circuit boards having at least metallic material, before the heating step, into a decomposition liquid containing at least one of ethylene glycol, propylene glycol, diethylene glycol, dipropylene glycol, isopropylene glycol, and sodium hydroxide solution.

18. A method for separating metallic material from waste printed circuit boards according to claim 17, the method comprising the steps of:

providing a belt conveyer moving upward and inclined relative to the horizontal plane;

supplying said metallic material separated in said separating step, onto said belt conveyer;

collecting a part of said metallic material each of said part having a shape which makes itself easily dropped, at bottom of said belt conveyer, in a metal collecting process; and collecting another part of said metallic material each of said part having a shape which makes itself hardly dropped, on top of said belt conveyer, in said metal collecting process.

19. A method for treating waste printed circuit boards according to claim 17, the method comprising the step of heating up said pulverized pieces of said substantial printed circuit board portion separated in said separating step, in an atmosphere avoiding the burning of said pulverized pieces, so that the temperature of at least said pulverized pieces become 350° C. or higher, in a heat and remove process; thereby removing said flame retardant from said pulverized pieces in said heat and remove process.

20. A method for treating waste printed circuit boards according to claim 17, the method comprising the step of dissolving out the heavy metals from said pulverized pieces by allowing said pulverized pieces of said substantial printed circuit board portion separated in said separating step to contact with water in this dissolve-out process.

21. A method for separating metallic material from waste printed circuit boards according to claim 12; wherein said pulverizing step is performed by providing an injecting means for injecting said particles at predetermined speed, and by injecting said particles at said heated-up waste printed circuit boards by said injecting means, and further by colliding said particles at said waste printed circuit boards.

22. A method for separating metallic material from waste printed circuit boards according to claim 21, wherein said heating step is performed so that said temperature of at least said printed circuit board portion becomes 350° C. or higher.

23. A method for separating metallic material from waste printed circuit boards according to claim 22, the method comprising the step, after said heating step, of cooling said waste printed circuit boards heated-up in said heating step; and wherein the substantial printed circuit board portion of said waste printed circuit boards cooled in said cooling step is pulverized in said pulverizing step.

24. A method for separating metallic material from waste printed circuit boards-according to claim 23, wherein said cooling step is performed in an atmosphere avoiding the burning of the printed circuit board portion of said waste printed circuit boards or in an atmosphere avoiding the oxidation of said metallic material of said waste printed circuit boards.

25. A method for separating metallic material from waste printed circuit boards according to claim 24, the method comprising the step of immersing said waste printed circuit boards having at least metallic material, before the heating step, into a decomposition liquid containing at least one of ethylene glycol, propylene glycol, diethylene glycol, dipropylene glycol, isopropylene glycol, and sodium hydroxide solution.

26. A method for separating metallic material from waste printed circuit boards according to claim 25, the method comprising the steps of:

providing a belt conveyer moving upward and inclined relative to the horizontal plane;

supplying said metallic material separated in said separating step, onto said belt conveyer;

collecting a part of said metallic material each of said part having a shape which makes itself easily dropped, at bottom of said belt conveyer, in a metal collecting process; and collecting another part of said metallic material each of said part-having a shape which makes itself hardly dropped, on top of said belt conveyer, in said metal collecting process.

27. A method for treating waste printed circuit boards according to claim 25, the method comprising the step of heating up said pulverized pieces of said substantial printed circuit board portion separated in said separating step, in an atmosphere avoiding the burning of said pulverized pieces, so that the temperature of at least said pulverized pieces become 350° C. or higher, in a heat and remove process; thereby removing said flame retardant from said pulverized pieces in said heat and remove process.

28. A method for treating waste printed circuit boards according to claim 25, the method comprising the step of dissolving out the heavy metals from said pulverized pieces by allowing said pulverized pieces of said substantial printed circuit board portion separated in said separating step to contact with water in this dissolve-out process.

29. A method for separating metallic material from waste printed circuit boards according to claim 12, wherein said heating step is performed so that said temperature of at least said printed circuit board portion becomes 350° C. or higher.

30. A method for separating metallic material from waste printed circuit boards according to claim 29, the method comprising the step, after said heating step, of cooling said waste printed circuit boards heated-up in said heating step; and wherein the substantial printed circuit board portion of said waste printed circuit boards cooled in said cooling step is pulverized in said pulverizing step.

31. A method for separating metallic material from waste printed circuit boards according to claim 30, wherein said cooling step is performed in an atmosphere avoiding the burning of the printed circuit board portion of said waste printed circuit boards or in an atmosphere avoiding the oxidation of said metallic material of said waste printed circuit boards.

32. A method for separating metallic material from waste printed circuit boards according to claim 31, the method comprising the step of immersing said waste printed circuit boards having at least metallic material, before the heating step, into a decomposition liquid containing at least one of ethylene glycol, propylene glycol, diethylene glycol, dipropylene glycol, isopropylene glycol, and sodium hydroxide solution.

33. A method for separating metallic material from waste printed circuit boards according to claim 32, the method comprising the steps of:

providing a belt conveyer moving upward and inclined relative to the horizontal plane;

supplying said metallic material separated in said separating step, onto said belt conveyer;

collecting a part of said metallic material each of said part having a shape which makes itself easily dropped, at bottom of said belt conveyer, in a metal collecting process; and collecting another part of said metallic material each of said part having a shape which makes itself hardly dropped, on top of said belt conveyer, in said metal collecting process.

34. A method for treating waste printed circuit boards according to claim 32, the method comprising the step of heating up said pulverized pieces of said substantial printed circuit board portion separated in said separating step, in an atmosphere avoiding the burning of said pulverized pieces, so that the temperature of at least said pulverized pieces become 350° C. or higher, in a heat and remove process; thereby removing said flame retardant from said pulverized pieces in said heat and remove process.

35. A method for treating waste printed circuit boards according to claim 32, the method comprising the step of dissolving out the heavy metals from said pulverized pieces by allowing said pulverized pieces of said substantial printed circuit board portion separated in said separating step to contact with water in this dissolve-out process.

36. A method for separating metallic material from waste printed circuit boards, the method comprising the steps of:

heating up waste the printed circuit boards having at least metallic material, in an atmosphere avoiding the burning of the printed circuit board portion of said waste printed circuit boards or in an atmosphere avoiding the oxidation of said metallic material, so that the temperature of at least the printed circuit board portion becomes 250° C. or higher and lower than 500° C.;

providing a cylindrical container having predetermined ribs on the inner face in the axial direction;

putting said waste printed circuit boards heated-up in said heating step, in said container;

rotating said container to allow said waste printed circuit boards to collide to the inner wall and/or said ribs of said container;

pulverizing the substantial printed circuit board portion of said waste printed circuit boards thereby; and separating the pulverized pieces of said substantial printed circuit board portion pulverized in said pulverizing step and said metallic material retained on said waste printed circuit boards, depending on the difference in the sizes of said pulverized pieces and of said metallic material.

37. A method for separating metallic material from waste printed circuit boards according to claim 36, wherein said heating step is performed so that said temperature of at least said printed circuit board portion becomes 350° C. or higher.

38. A method for separating metallic material from waste printed circuit boards according to claim 37, the method comprising the step, after said heating step, of cooling said waste printed circuit boards heated-up in said heating step; and wherein the substantial printed circuit board portion of said waste printed circuit boards cooled in said cooling step is pulverized in said pulverizing step.

39. A method for separating metallic material from waste printed circuit boards according to claim 38, wherein said cooling step is performed in an atmosphere avoiding the burning of the printed circuit board portion of said waste printed circuit boards or in an atmosphere avoiding the oxidation of said metallic material of said waste printed circuit boards.

40. A method for separating metallic material from waste printed circuit boards according to claim 39, the method comprising the step of immersing said waste printed circuit boards having at least metallic material, before the heating step, into a decomposition liquid containing at least one of ethylene glycol, propylene glycol, diethylene glycol, dipropylene glycol, isopropylene glycol, and sodium hydroxide solution.

41. A method for separating metallic material from waste printed circuit boards-according to claim 40, the method comprising the steps of:

providing a belt conveyer moving upward and inclined relative to the horizontal plane;

supplying said metallic material separated in said separating step, onto said belt conveyer;

collecting a part of said metallic material each of said part having a shape which makes itself easily dropped, at bottom of said belt conveyer, in a metal collecting process; and collecting another part of said metallic material each of said part having a shape which makes itself hardly dropped, on top of said belt conveyer, in said metal collecting process.

42. A method for treating waste printed circuit boards according to claim 40, the method comprising the step of heating up said pulverized pieces of said substantial printed circuit board portion separated in said separating step, in an atmosphere avoiding the burning of said pulverized pieces, so that the temperature of at least said pulverized pieces become 350° C. or higher, in a heat and remove process; thereby removing said flame retardant from said pulverized pieces in said heat and remove process.

43. A method for treating waste printed circuit boards according to claims 40, the method comprising the step of dissolving out the heavy metals from said pulverized pieces by allowing said pulverized pieces of said substantial printed circuit board portion separated in said separating step to contact with water in this dissolve-out process.

44. A method for separating metallic material from waste printed circuit boards, the method comprising the steps of:

heating up the waste printed circuit boards having at least metallic material, in an atmosphere avoiding the burning of the printed circuit board portion of said waste printed circuit boards or in an atmosphere avoiding the oxidation of said metallic material, so that the temperature of at least said printed circuit board portion becomes 250° C. or higher and lower than 500° C.;

throwing said waste printed circuit boards heated-up in said heating step, at a predetermined object, thereby to collide said waste printed circuit boards at said object;

pulverizing the substantial printed circuit board portion of said waste printed circuit boards thereby; and separating the pulverized pieces of said substantial printed circuit board portion pulverized in said pulverizing step and said metallic material retained on said waste printed circuit boards, depending on the difference in the sizes of said pulverized pieces and of said metallic material.

45. A method for separating metallic material from waste printed circuit boards according to claim 44, wherein said heating step is performed so that said temperature of at least said printed circuit board portion becomes 350° C. or higher.

46. A method for separating metallic material from waste printed circuit boards according to claim 45, the method comprising the step, after said heating step, of cooling said waste printed circuit boards heated-up in said heating step; and wherein the substantial printed circuit board portion of said waste printed circuit boards cooled in said cooling step is pulverized in said pulverizing step.

47. A method for separating metallic material from waste printed circuit boards according to claim 46, wherein said cooling step is performed in an atmosphere avoiding the burning of the printed circuit board portion of said waste printed circuit boards or in an atmosphere avoiding the oxidation of said metallic material of said waste printed circuit boards.

48. A method for separating metallic material from waste printed circuit boards according to claim 47, the method comprising the step of immersing said waste printed circuit boards having at least metallic material, before the heating step, into a decomposition liquid containing at least one of ethylene glycol, propylene glycol, diethylene glycol, dipropylene glycol, isopropylene glycol, and sodium hydroxide solution.

49. A method for separating metallic material from waste printed circuit boards according to claim 48, the method comprising the steps of:

providing a belt conveyer moving upward and inclined relative to the horizontal plane;

supplying said metallic material separated in said separating step, onto said belt conveyer;

collecting a part of said metallic material each of said part having a shape which makes itself easily dropped, at bottom of said belt conveyer, in a metal collecting process; and collecting another part of said metallic material each of said part having a shape which makes itself hardly dropped, on top of said belt conveyer, in said metal collecting process.

50. A method for treating waste printed circuit boards according to claim 40, the method comprising the step of heating up said pulverized pieces of said substantial printed circuit board portion separated in said separating step, in an atmosphere avoiding the burning of said pulverized pieces, so that the temperature of at least said pulverized pieces become 350° C. or higher, in a heat and remove process; thereby removing said flame retardant from said pulverized pieces in said heat and remove process.

51. A method for treating waste printed circuit boards according to claim 48, the method comprising the step of dissolving out the heavy metals from said pulverized pieces by allowing said pulverized pieces of said substantial printed circuit board portion separated in said separating step to contact with water in this dissolve-out process.

* * * * *

UNITED STATES PATENT AND TRADEMARK OFFICE
CERTIFICATE OF CORRECTION

PATENT NO. : 6,336,601 B1  Page 1 of 1
DATED : January 8, 2002
INVENTOR(S) : Ueno et al.

It is certified that error appears in the above-identified patent and that said Letters Patent is hereby corrected as shown below:

<u>Column 40,</u>
Line 59, "40" should read -- 48 --.

Signed and Sealed this

Fourteenth Day of January, 2003

JAMES E. ROGAN
*Director of the United States Patent and Trademark Office*